United States Patent [19]

Wessler

[11] 4,203,075
[45] May 13, 1980

[54] PHASE LOCKED LOOP CIRCUIT FOR VIDEO HARD COPY CONTROLLER

[75] Inventor: Louis E. Wessler, Cupertino, Calif.
[73] Assignee: Xerox Corporation, Stamford, Conn.
[21] Appl. No.: 843,012
[22] Filed: Oct. 17, 1977
[51] Int. Cl.² .............................................. H03B 3/04
[52] U.S. Cl. .................................... 331/1 A; 331/14; 331/25; 358/264
[58] Field of Search ............... 358/280, 264; 331/1 A, 331/14, 18, 25

[56] References Cited
U.S. PATENT DOCUMENTS 3,688,210  8/1972  Fort et al. ........................ 331/14 X Primary Examiner—Siegfried H. Grimm
Attorney, Agent, or Firm—Barry Paul Smith

[57] ABSTRACT

A phase-locked loop circuit includes a voltage controlled oscillator responsive to a control voltage for generating a periodic first output signal comprised of pulses occurring at a first frequency determined by the value of said control voltage. In response to the first output signal, a periodic feedback signal is generated comprised of pulses occurring at a second frequency which bears a predetermined relationship toward the first frequency. In response to the feedback signal and to a first input signal having a first periodic interval during which pulses at a third frequency occur and a second periodic interval during which said pulses at the third frequency do not occur, a second output signal is generated comprised of the pulses of the first input signal during the first periodic interval of the input signal and the pulses of the feedback signal during the second periodic interval of the first input signal. Finally, in response to the feedback signal and the second output signal, a control voltage is generated having a value dependent upon the phase differential between the feedback signal and the second output signal.

12 Claims, 24 Drawing Figures

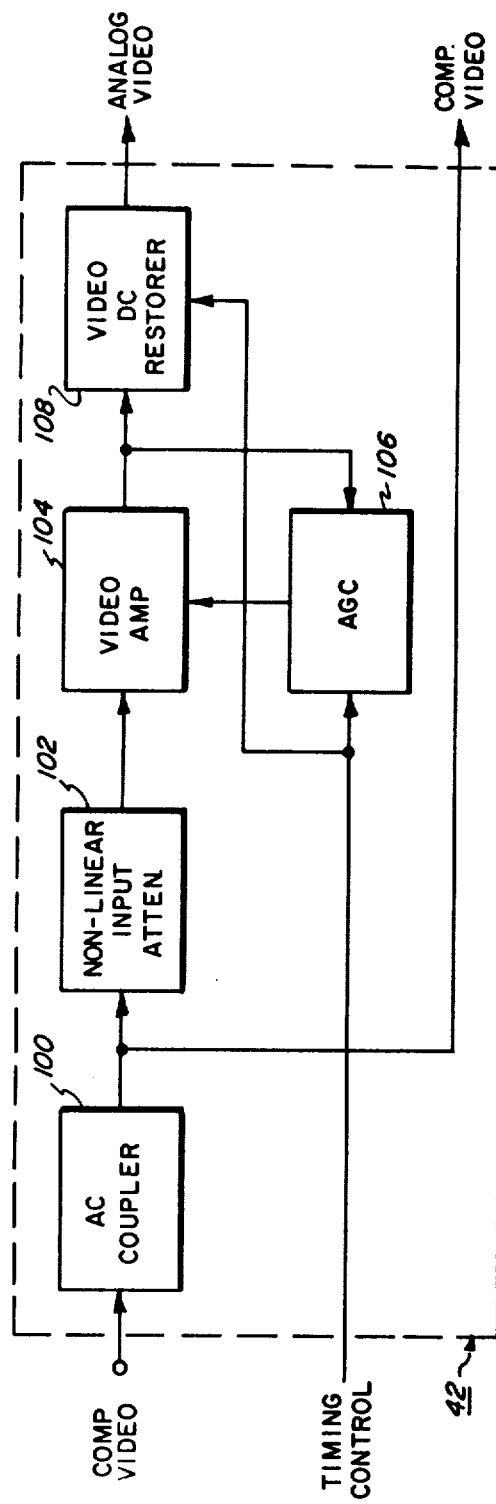
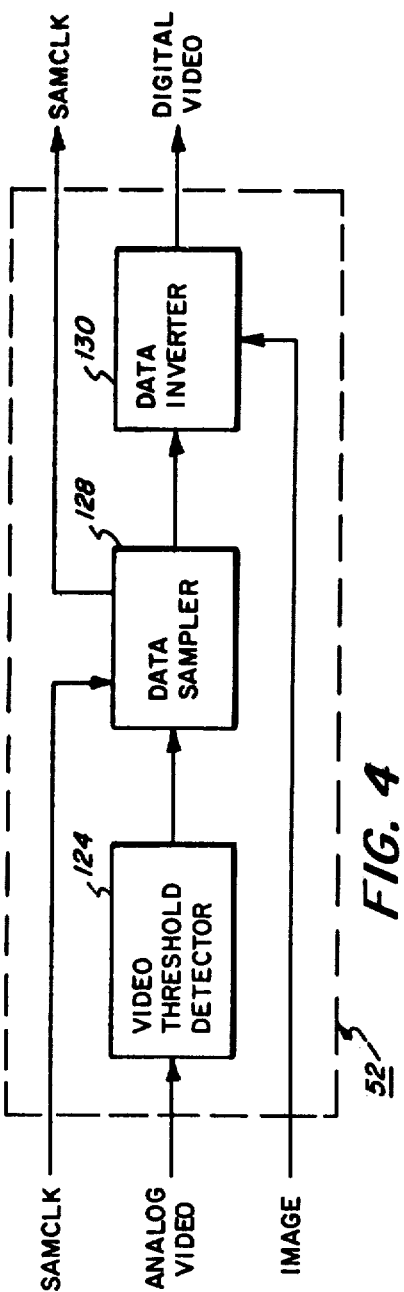
FIG. 3
FIG. 4

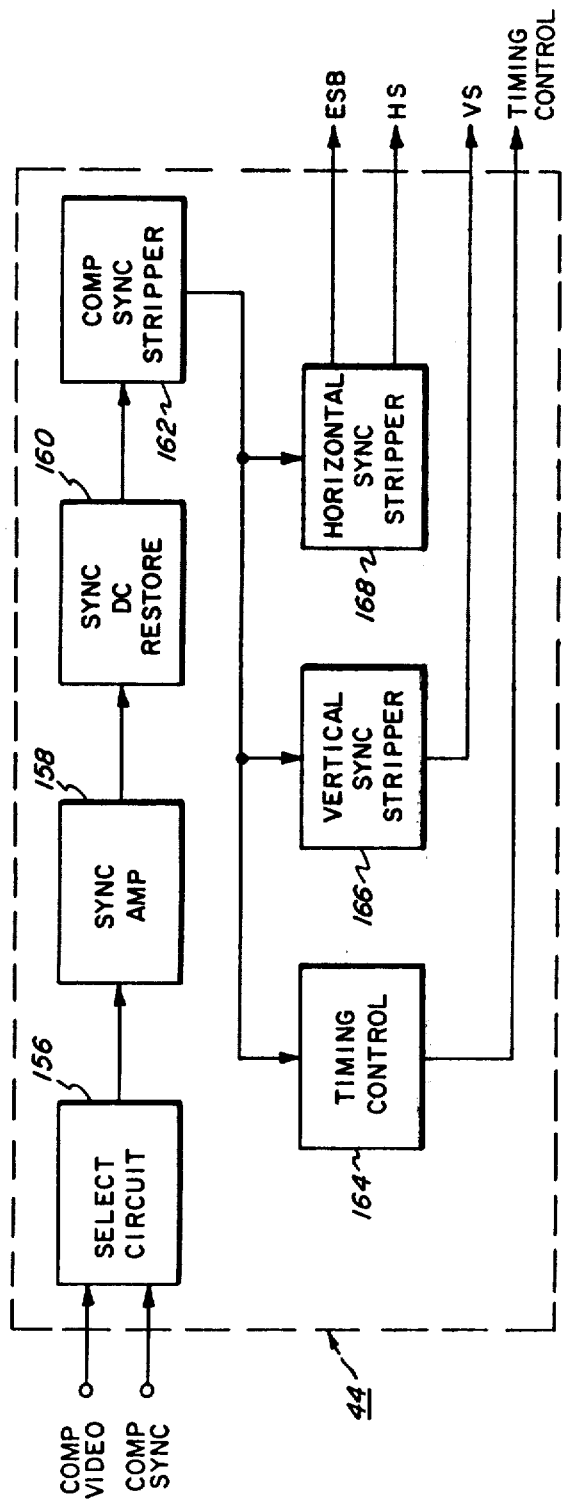
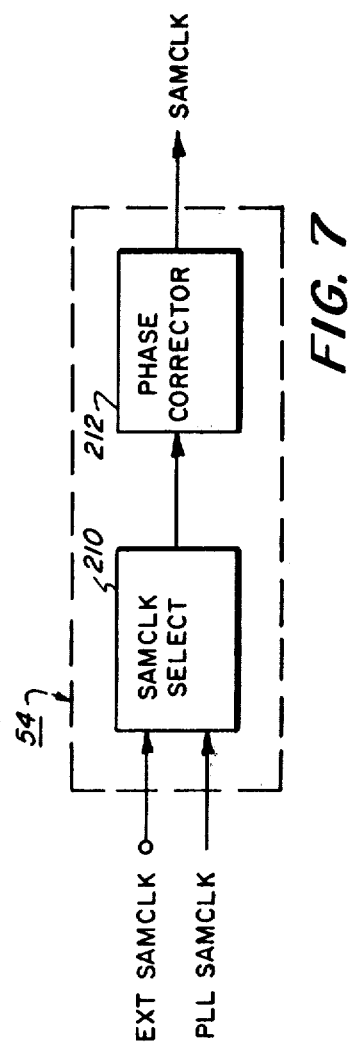
FIG. 5
FIG. 7

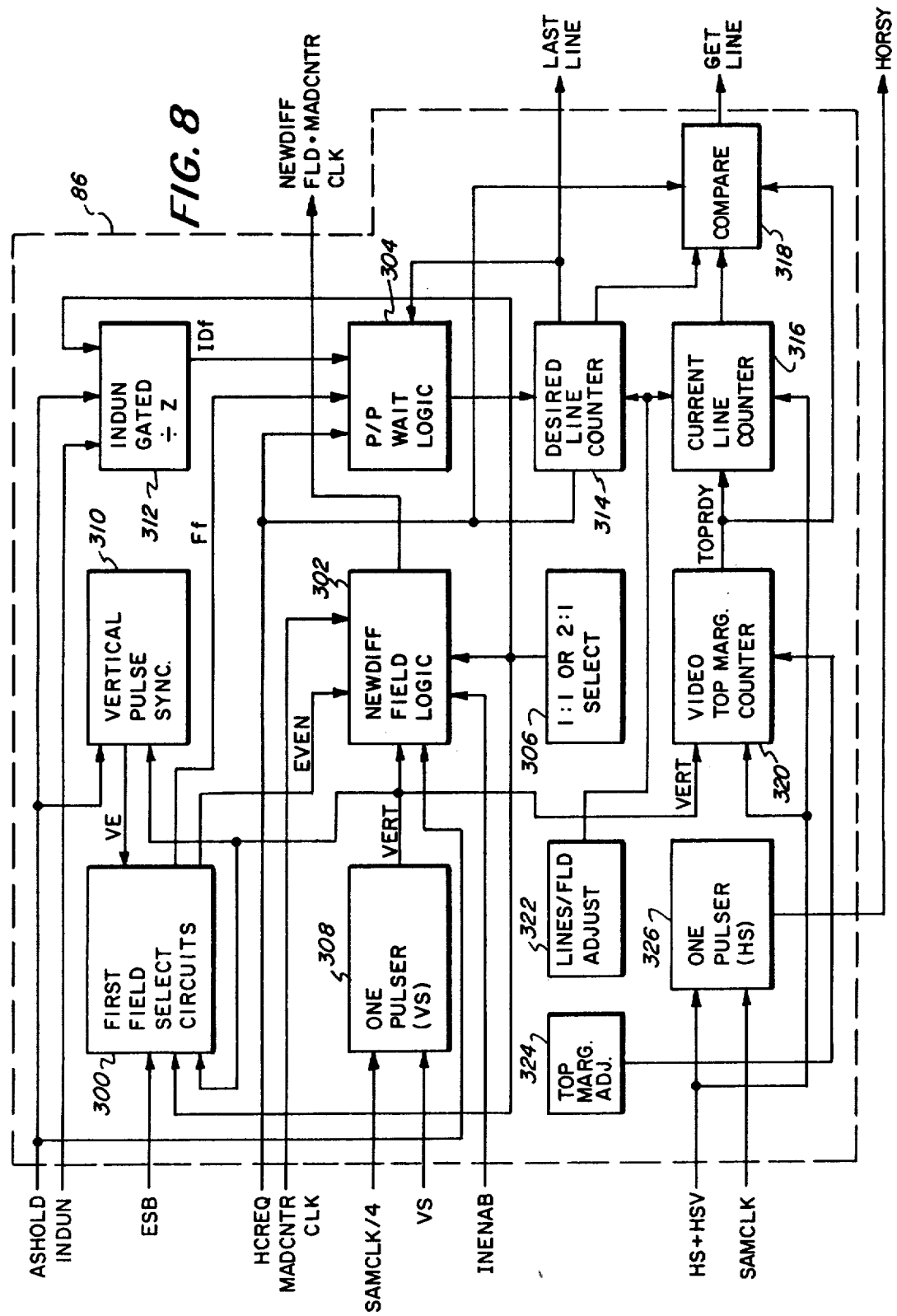

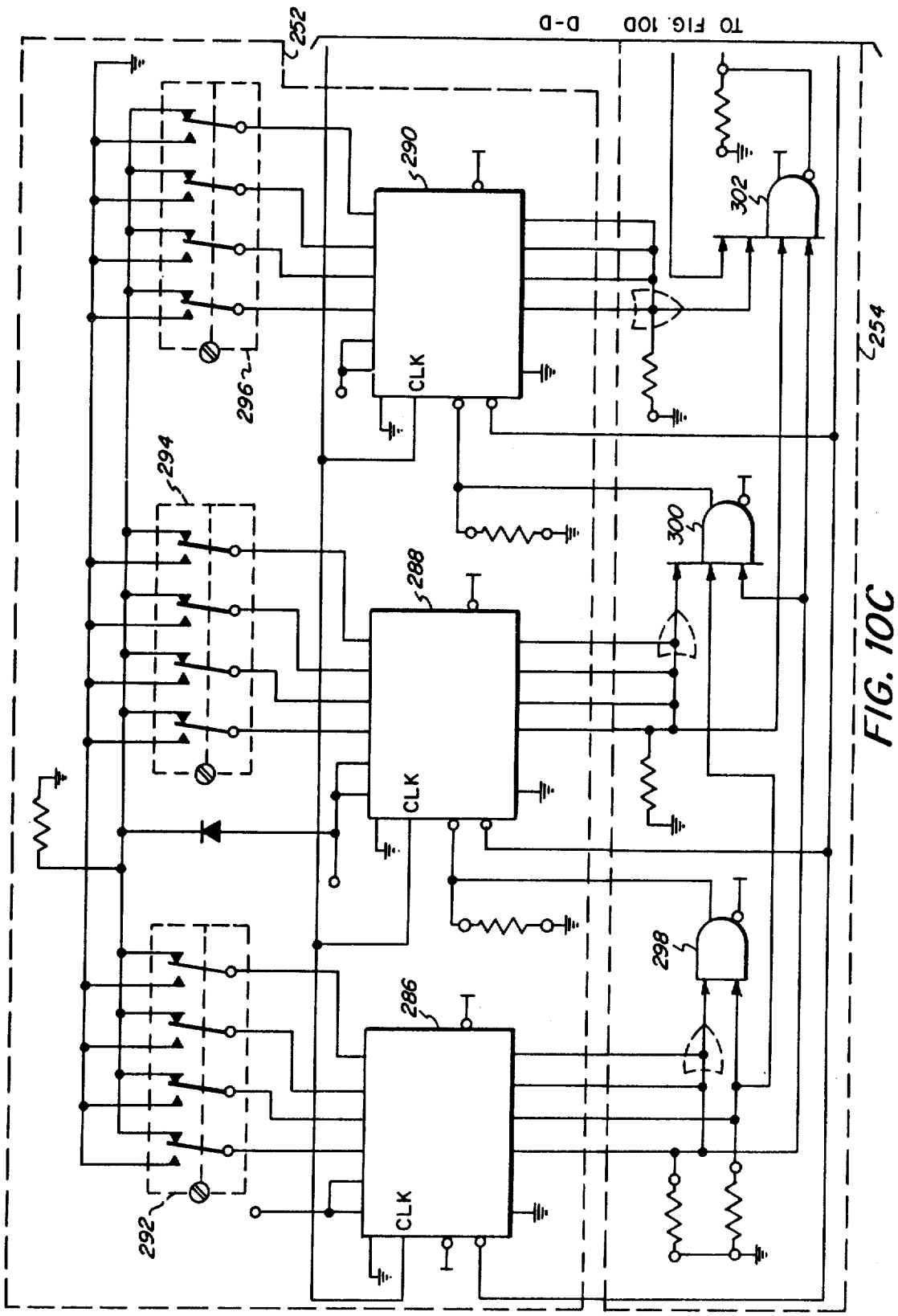

PHASE LOCKED LOOP CIRCUIT FOR VIDEO HARD COPY CONTROLLER

CROSS REFERENCE TO RELATED APPLICATIONS

This application is related to the following copending applications filed concurrently herewith and assigned to the assignee of the present invention:

(1) U.S. Application Ser. No. 842,992 filed in the names of Louis E. Wessler, Kenneth F. Koch and Andrew J. Cleveland for VIDEO HARD COPY CONTROLLER.

(2) U.S. Application Ser. No. 842,991 filed in the names of Louis E. Wessler and Kenneth F. Koch for AUTOMATIC GAIN CONTROL FOR VIDEO AMPLIFIER.

(3) U.S. Application Ser. No. 843,006 filed in the names of Louis E. Wessler and Kenneth F. Koch for VIDEO INPUT CIRCUITS FOR VIDEO HARD COPY CONTROLLER.

(4) U.S. Application Ser. No. 843,011 filed in the names of Louis E. Wessler and Kenneth F. Koch for VIDEO DATA DETECT CIRCUITS FOR VIDEO HARD COPY CONTROLLER.

BACKGROUND OF THE INVENTION

This invention relates to phase-locked loop circuits and, more particularly, to phase-locked loop circuits which are especially, although not exclusively, suited for use in controllers for converting and formatting video data into digital data.

Phase-locked loop circuits are, of course, entirely conventional. Typical such circuits include a voltage controlled oscillator responsive to a control voltage for generating a periodic output signal comprised of pulses occurring at a first frequency determined by the value of the control voltage. A periodic feedback signal is then derived from the output signal and is compared with a reference signal to generate the requisite control voltage.

Controllers of the type above-described typically receive composite video data comprised of a video data component and a synchronization component including both horizontal sync pulses and vertical sync pulses. It is generally necessary to derive a sample clock signal from the horizontal sync pulses which has pulses at a frequency proportional to the horizontal sync pulses. A problem arises, however, since the horizontal sync pulses are normally missing during each vertical sync interval.

It would be desirable to provide a phase-locked loop circuit especially suited for use in a controller of the type above described that is capable of generating sample clock pulses which are stable in frequency and phase during each vertical sync interval notwithstanding the absence of horizontal sync pulses during that interval.

SUMMARY OF THE INVENTION

In accordance with the invention, a phase-locked loop circuit is provided comprising a voltage controlled oscillator responsive to a control voltage for generating a periodic output signal comprised of pulses occurring at a first frequency determined by the value of said control voltage; first means responsive to said output signal for generating a periodic feedback signal comprised of pulses occurring at a second frequency which bears a predetermined relationship toward said first frequency; second means, responsive to said feedback signal and to a first input signal having a first periodic interval during which pulses at a third frequency occur and a second periodic interval during which said pulses of said third frequency do not occur, for generating an output signal comprised of the pulses of said first input signal during the first periodic interval of said input signal and the pulses of said feedback signal during the second periodic interval of said first input signal; and third means responsive to the feedback signal from said first means and the output signal from said second means for generating said control voltage having a value dependent upon the phase differential between said feedback signal and the output signal from said second means.

In accordance with the preferred embodiment, the output signal from the voltage controlled oscillator comprises the sample clock pulses, the feedback signal provides horizontal sync variable (HSV) pulses, and the first input signal provides the horizontal sync (HS) pulses as a reference. Then, the output of the first means is either the HS pulses during the non-vertical sync interval or the HSV pulses during the vertical sync interval, thereby allowing the phase-locked loop circuit to "free-wheel" during the vertical sync interval. Such capability lends stability of frequency and phase to the sample clock pulses during each vertical sync interval and immediately thereafter.

These and other aspects and advantages of the present invention will be more completely described below with reference to the accompanying drawings.

BRIEF DESCRIPTION OF THE DRAWINGS

FIG. 3 is a schematic block diagram of the video input circuits depicted in FIG. 2;

FIG. 4 is a schematic block diagram of the data detect circuits depicted in FIG. 2;

FIG. 5 is a schematic block diagram of the sync circuits depicted in FIG. 2;

FIG. 7 is a schematic block diagram of the SAMCLK circuits depicted in FIG. 2;

FIG. 8 is a schematic block diagram of the video line pointer circuits depicted in FIG. 2;

DESCRIPTION OF THE PREFERRED EMBODIMENT

Figure 1:
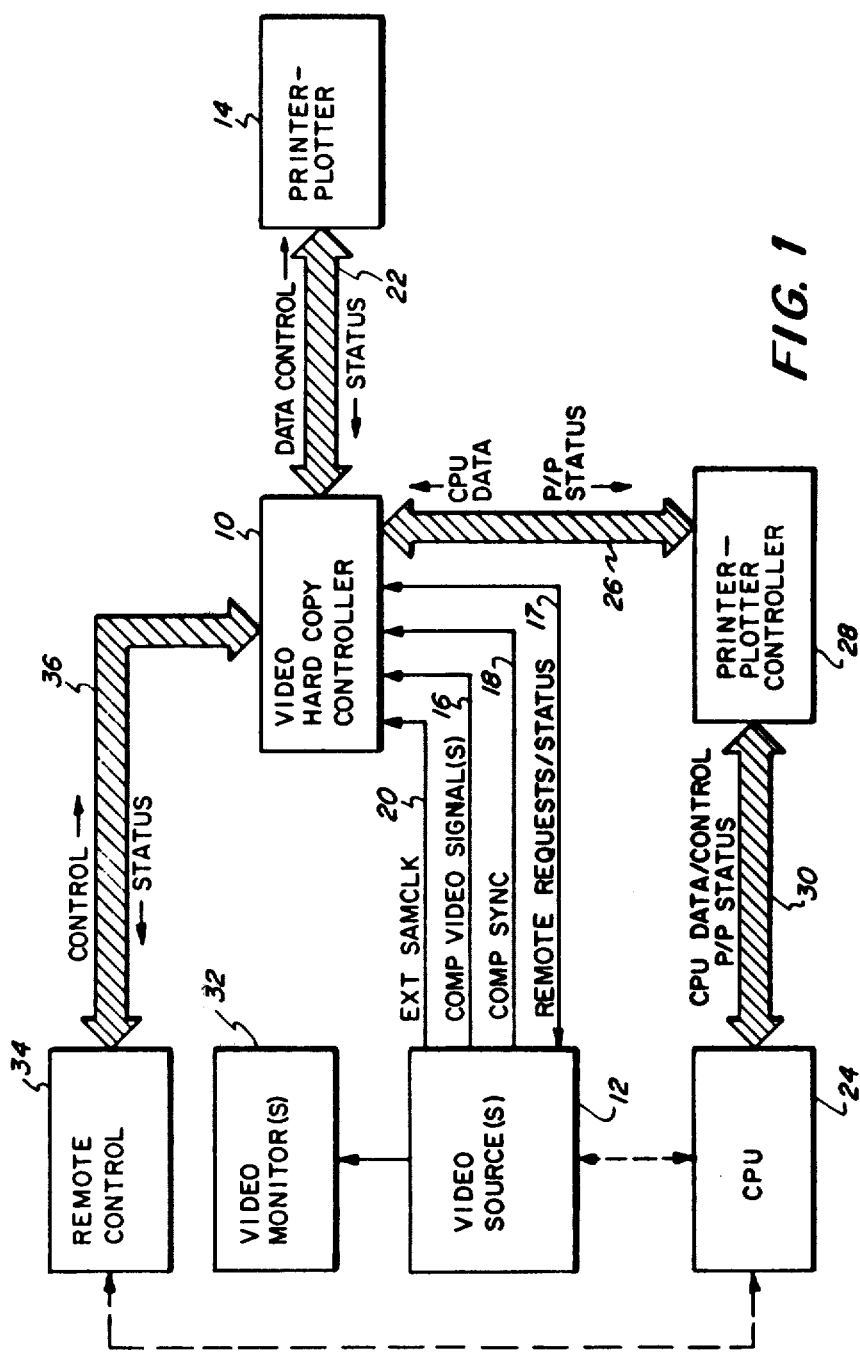
FIG. 1 is a schematic block diagram of a video hard copy reproduction system incorporating the video hard copy controller of the present invention.

Referring to FIG. 1, a video hard copy controller 10 is shown having the primary function of converting and formatting video signals supplied thereto from one or more video sources 12 into digital data utilizable by a hard copy generating device 14 in order to produce hard copy facsimiles of the images represented by such video signals. A particularly preferred hard copy generating device 14 is an electrostatic printer-plotter of the type having at least one linear array of electrostatic recording styli or nibs capable of forming an electrostatic latent image on a copy medium that may be developed by suitable developing material. An exemplary printer-plotter of this type if the Versatec Model 1200 Printer-Plotter manufactured by Versatec Inc. of Santa Clara, Calif. It will become apparent from the description to follow that other hard copy generating devices can be employed.

The video signals supplied to the controller 10 from each video source may be in accordance with either EIA or TTL standards. For purposes of future explanation and by way of example, it shall be assumed that there are a plurality of video sources 12, each capable of generating composite video (COMP VIDEO) signals satisfying either of the above industry standards. As is known, COMP VIDEO signals include not only video data, but also horizontal and vertical sync pulses and horizontal and vertical blanking intervals (see *Closed-Circuit* TV for Engineers and Technicians, Leonard C. Showalter, Howard W. Sams & Co., 1969 and EIA Standards: RS-170, RS-330, RS-343, RS-375, RS-412, Electronic Industries Association, latest revisions).

As will be described in more detail below, the controller 10 includes means for selecting one of the COMP VIDEO signals from the video sources 12 to be converted and formatted by the controller 10 into digital data utilizable by the printer-plotter 14. The controller 10 is also capable of receiving an external sample clock (EXT SAMCLK) signal and a composite sync (COMP SYNC) signal generated by suitable, conventional devices (not shown) included within the video sources block 12. Thus, transmitted from the video sources block 12 are one or more COMP VIDEO signals along respective ones of a plurality of lines 16, a COMP SYNC signal along a line 18, and an EXT SAMCLK signal along a line 20. Additionally, each video source 12 is capable of generating various remote control signals along respective ones of lines 17. One such control signal is a hard copy request (HCREQ), as will be explained below. Various printer-plotter status signals may be forwarded back to the video sources 12 along other respective ones of lines 17.

The controller 10 includes means to be described below for stripping the video data out of the COMP VIDEO signal and then converting it to digital data one byte at a time. When all the bytes forming a single video line have been gathered in the controller 10, they are applied a byte at a time on the data portion of a bus 22 from the controller to the printer-plotter 14. The bus also carries control signals from the controller 10 to the printer-plotter 14 and status signals from the printer-plotter 14 to the controller. The total number of video bits for each video line ("pixels") gathered by the controller 10 are desireably either directly equal to or equal to integer multiples of the number of nibs on the printer-plotter 14.

Alternatively to converting and formatting video signals and supplying them as digital data along the bus 22 to the printer-plotter 14, the controller 10 is adapted to receive image and control information from a central processing unit (CPU) 24. This information is supplied first along a bus 30 to a standard printer-plotter controller 28 for proper formatting of the information. The information is then applied along a bus 26 to the controller 10. The controller 28 may be, by way of example, the Versatec Model 121 Controller manufactured by Versatec, Inc. The CPU originated image and control information forwarded to the controller 10 along the bus 26 is applied directly through the controller 10, which is basically "transparent" thereto, onto the bus 22 for transmittal to the printer-plotter 14. Status signals from the printer-plotter 14 are applied to the CPU 24 along the bus 22, through the controller 10, along the bus 26, through the controller 28 and along the bus 30. As will be described in detail below, the controller 10 contains appropriate priority and switching circuits to service both the CPU 24 and the video sources 12, should both be active at or about the same time.

If desired, the system of FIG. 1 may include one or more conventional video monitors 32 respectively associated with each of the video sources 12 for receiving the COMP VIDEO signals therefrom in order to display the video data contained therein.

As will be described in more detail below, the controller 10 has various panel controls (not shown in FIG. 1) that are operator initiated, as well as various status indicator lights (not shown). Optionally, and if desired, a remote control device 34 may be employed to generate various control signals on a bus 36 for application to the controller 10 and to receive status signals on the bus 36 from the controller 10. An example of a remote control device 34 is a keyboard having various status indicator lights thereon or associated therewith. The video sources 12 and remote control device 34 may ultimately themselves be controlled by the CPU 24. The controller 10 includes means to be described below for establishing communication with either the local operator initiated control portion of the controller 10 or the remote control 34.

Figure 2A:
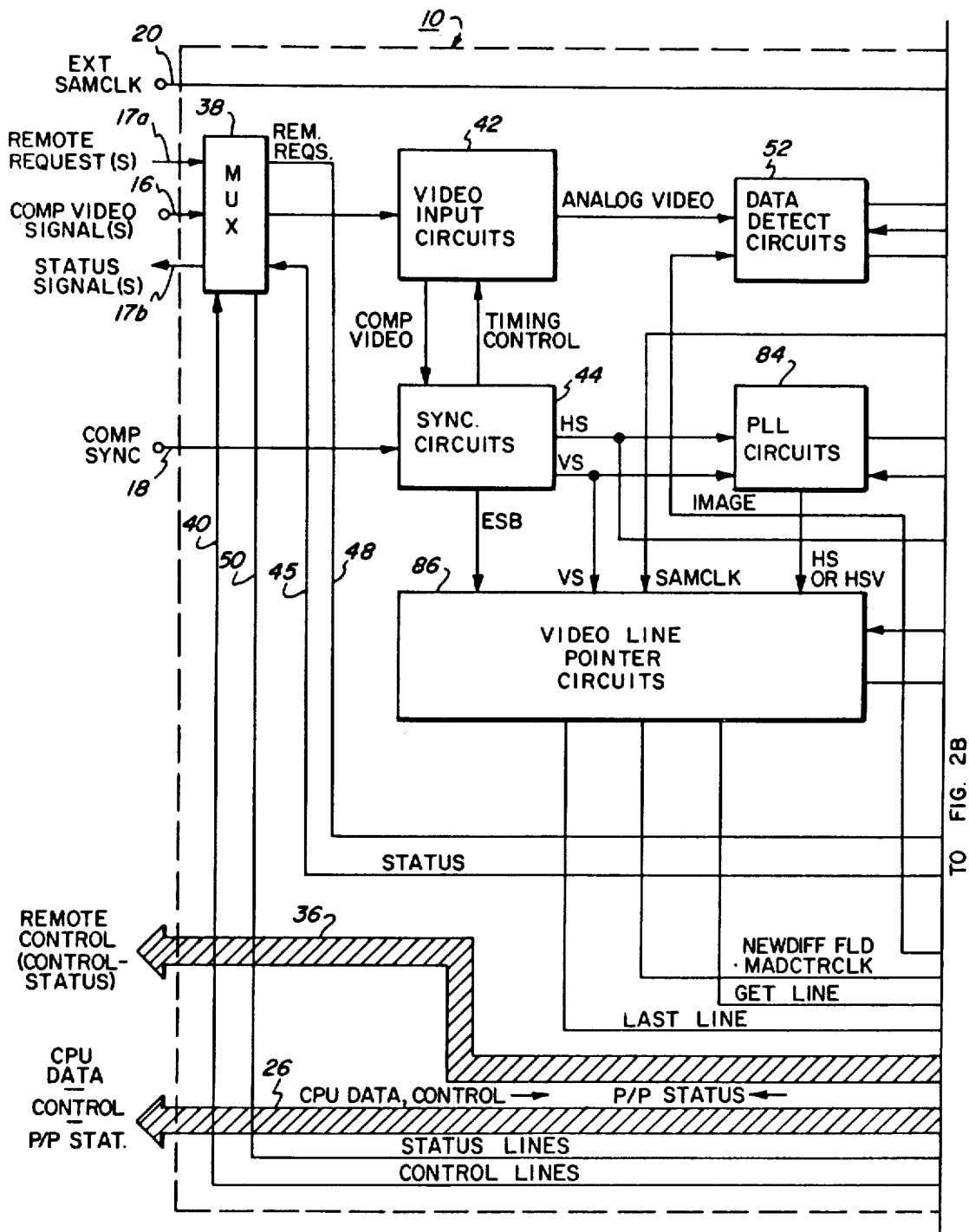
FIG. 2, comprised of FIGS. 2A-2C, is a schematic block diagram of the video hard copy controller depicted in FIG. 1.
Figure 2B:
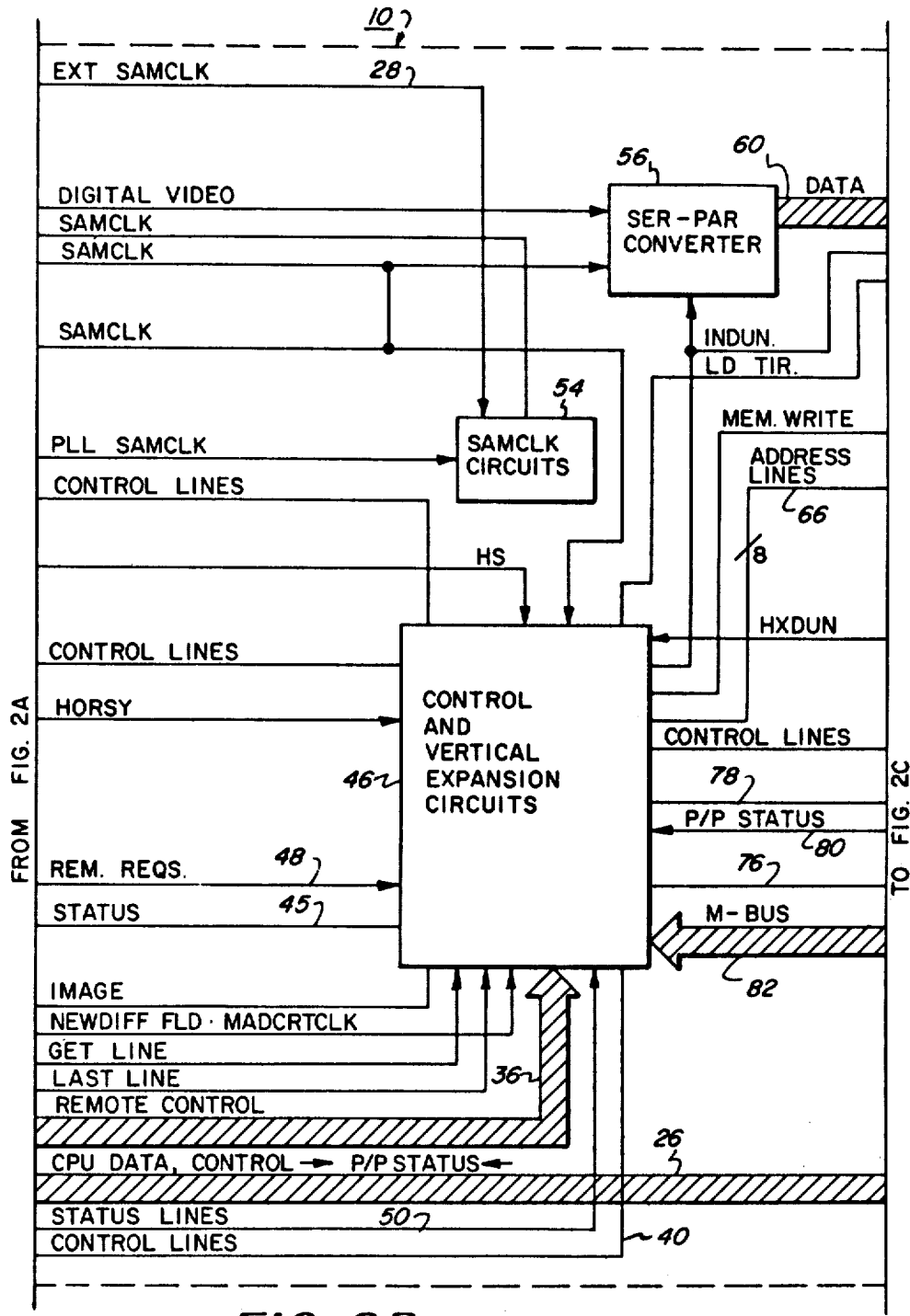
Figure 2C:
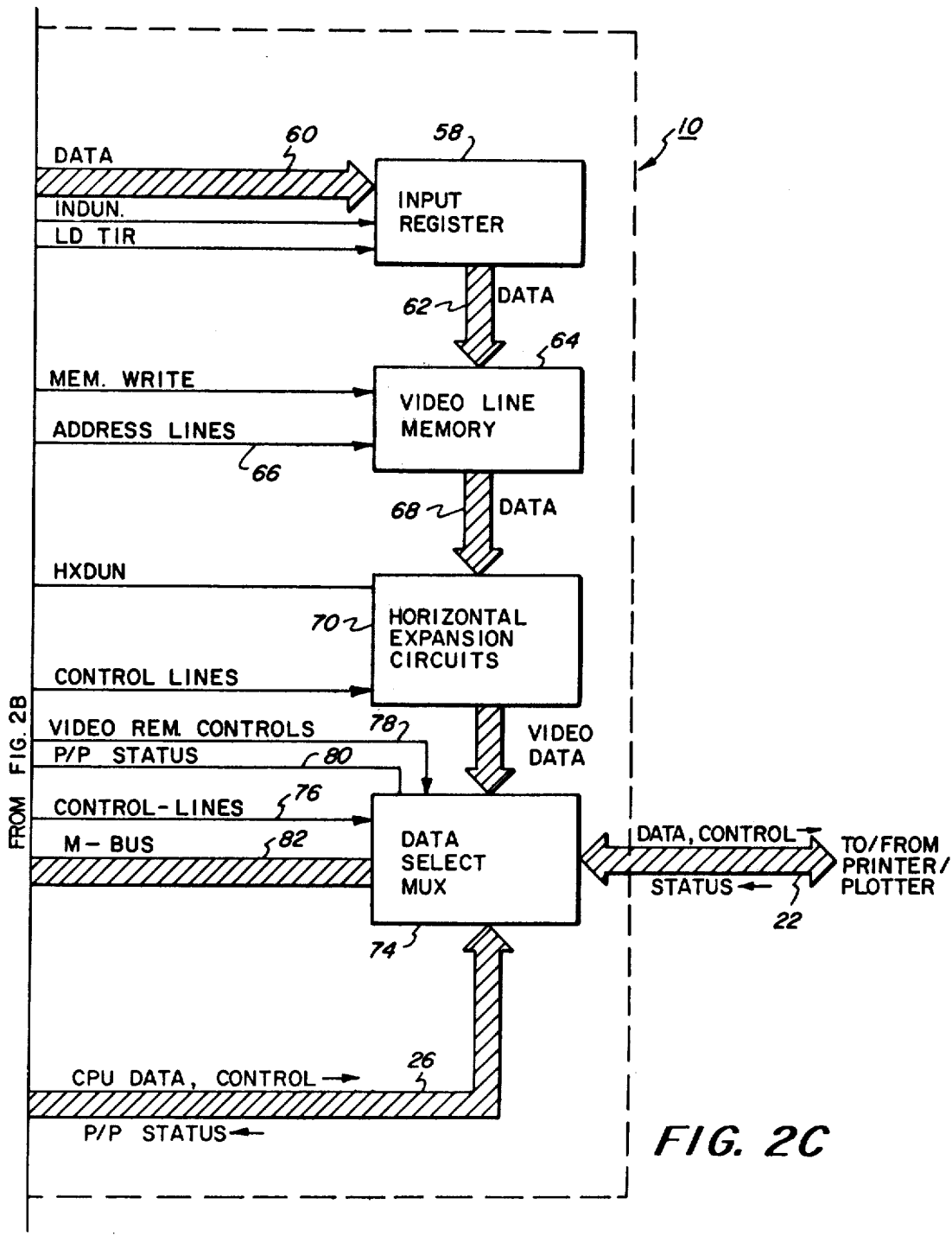

Reference is now had to FIG. 2 where the video hard copy controller 10 will be described in more specific terms. As shown, the controller 10 preferably includes a video source multiplexer 38 for receiving on respective ones of lines 16 each of the plurality of COMP VIDEO signals that may be generated from the plural video sources 12. The multiplexer 38 also is adapted to receive on respective ones of lines 17a each of the remote request signals that may be generated from the video sources 12. The multiplexer 38 further is adapted to forward various printer-plotter status signals to selected one(s) of the video sources 12 on respective one(s) of lines 17b. These status signals are forwarded to the multiplexer 38 on lines 45 from special control circuits 46 included in the controller 10. The multiplexer 38 is controlled by control signals on lines 40 from the control circuits 46. Specifically, in response to such control signals, the multiplexer 38 selects one of the COMP VIDEO signals supplied from the plural video sources 12 and forwards such selected COMP VIDEO signal to video input circuits 42 included within the controller 10. Additionally, each of the remote request signals that are received by the multiplexer 38 are forwarded to the control circuits 46 along lines 48. Lastly, the multiplexer 38 supplies status signals concerning its own operative status to the control circuits 46 on lines 50.

The video input circuits 42 amplify with automatic gain control (AGC) and then "d-c restore" the selected COMP VIDEO signal applied thereto from the video source multiplexer 38 in order to generate an analog video signal at its output. To "d-c restore" is to reconstitute the original signal in such a manner that all portions of the resulting signal waveform train over time remains in the same amplitude relationship relative to an arbitrary reference (d-c common level) as the original signal waveform train regardless of the waveforms shape or changes of shape or instantaneous geometric centroid.

The AGC portion of circuits 42 controls the video amplifier in a closed loop fashion to maintain a substantially constant voltage between the tip of each horizontal sync (HS) pulse and the so-called "backporch" level. These two voltage levels are sampled and stored under control of timing control pulses supplied from synchronization (sync) circuits 44. The d-c restore circuitry drives the backporch level to a predetermined reference level, such as one silicon junction voltage drop (controlled offset) above ground, to eliminate the effects of common ground noise in detecting the black and white levels of the video data. The video input circuits 42 also relay the COMP VIDEO signal to the sync circuits 44. The video input circuits will be described in more detail below with reference to FIG. 3.

The ANALOG VIDEO signal developed at the output of the video input circuits 42 is applied to data detect circuits 52. The data detect circuits sample the video data portion of the ANALOG VIDEO signal at a predetermined rate determined by the frequency of a sample clock (SAMCLK) signal generated at the output of SAMCLK circuits 54. The frequency of SAMCLK is a desired multiple of the frequency of the HS pulses and related to the data content of a given video line. The data detect circuits 52 thereby generate a serial DIGITAL VIDEO signal at their outputs corresponding to the sampled ANALOG VIDEO signal input. The data detect circuits are also capable of selectively inverting the DIGITAL VIDEO signal in dependence upon the state of an IMAGE signal generated by the control circuits 46 in a manner to be described below. Specific details of the data detect circuits 52 will also be described in more detail below with reference to FIG. 4.

The serial DIGITAL VIDEO signal at the output of the data detect circuits 52 is applied to a serial-to-parallel converter 56 which is enabled by an "input done" (INDUN) signal from the control circuits 46 and is clocked by the SAMCLK signal from the SAMCLK circuits 54. The serial DIGITAL VIDEO signal is assembled into individual bytes (e.g. 8-bits) by the converter 56. As each group of eight-bit bytes is loaded in series into the converter 56, the INDUN signal goes true, enabling the converter to apply the resultant byte in bit-parallel format along a bus 60 to a temporary input register 58. The byte is loaded into the register 58 upon receipt by the register of a "load temporary input register" (LDTIR) signal from the control circuits 46. Each byte of video data loaded into the input register 58 is applied in parallel on a bus 62 to a video line memory 64 or multiples of video line memories.

The bytes defining each complete video line are loaded, one byte at a time, into predetermined storage locations of the memory 64 determined by an 8-bit address signal applied to the memory 64 on address lines 66 from the control circuits 46. A signal MEM WRITE determines whether a byte of video data is to be written into the memory 64 or read from the memory 64. Once an entire video line of digital video has been stored ("gathered") in the memory 64, the state of the MEM WRITE signal is changed in order for the entire line of video data to be forwarded a byte at a time along a bus 68 to horizontal expansion circuits 70. The horizontal expansion circuits 70 are controlled by various control signals from the control circuits 46 in order to set the desired degree of horizontal expansion of each video line. Details of presently preferred serial-to-parallel converter, input register, video line memory and horizontal expansion circuits will be discussed in more detail below.

Following any desired horizontal expansion, each byte of video line data applied in parallel on a bus 72 to a data select multiplexer 74. The multiplexer 74 is controlled by various control signals applied thereto on lines 76 from the control circuits 46 to either apply (1) the video data on bus 72 along with video remote controls on lines 78 to the printer-plotter 14 along bus 22, with printer-plotter status being applied from the bus 22 along lines 80 to the control circuits 46, or (2) the CPU data and control signals on bus 26 to the printer-plotter 14 along bus 22, with printer-plotter status being applied from the bus 22 back along the bus 26 to the controller 28 and eventually to the CPU 24 along the bus 30. Signals applied along an M-bus 82 back to the control circuits 46 essentially represents the "OR" of the video data on bus 72 and the CPU data on bus 26 and are used for priority control, as will be described below.

Still referring to FIG. 2, the sync circuits 44 receive the selected COMP VIDEO signal from the video source multiplexer 38, as well as the external COMP SYNC signal from the video sources 12 along line 18. The sync circuits 44 select between the COMP SYNC component of the selected COMP VIDEO signal and the external COMP SYNC signal, as far as which is to be employed in the system. The selected signal is then amplified with AGC and d-c restored. The COMP SYNC signal ultimately is used to generate the timing control signals that are applied to the video input circuits 42. Additionally, the horizontal sync (HS) and vertical sync (VS) pulses are "stripped" from COMP SYNC. The HS pulses are forwarded to phase-locked-loop (PLL) circuits 84 and the control circuits 46, and the VS pulses are forwarded to the PLL circuits 84 and to video line pointer circuits 86. The sync circuits 44 also generate equalizing and serration blanking (ESB) signals in order to blank out the serration and equalizing pulses in the COMP VIDEO signals. The ESB signals are applied to the video line pointer circuits 86.

The basic function of the PLL circuits 84 is to generate a PLL SAMCLK signal having a frequency at a desired multiple of the frequency of the HS pulses. Additionally, the PLL circuits 84 forward either the HS pulses or HSV pulses to the video line pointer circuits 86. The specific nature of the HSV pulses will be described below in connection with a more detailed description of the PLL circuits in FIGS. 6 and 10. The PLL circuits receive as inputs the HS and VS signals from the sync circuits 44, and various control signals from the control circuits 46.

The PLL SAMCLK signal generated by the PLL circuits 84 is applied to the SAMCLK circuits 54. The latter circuits also receive the EXT SAMCLK signal along the line 20 and then select between such two sample clocks. The selection is accomplished by an operator controlled switch (not shown) on the control panel. The selected SAMCLK signal is forwarded to the data detect circuits 52, and from there to the control circuits 46, the serial-to-parallel converter 56, and the video line pointer circuits 86.

The video line pointer circuits 86 respond to various inputs signals, i.e. ESB and VS from the sync circuits 44, HS or HSV from the PLL circuits 84, SAMCLK from the data detect circuits 52 and various control signals from the control circuits 46. The video line pointer circuits 86 generate three output signals. One such output signal is a GET LINE signal which indicates that the continuously refreshed video frame has reached a line corresponding to the next line desired to be formed as hard copy by the printer-plotter 14. In this regard, it is noted that the print-plot rate of the printer-plotter 14 is normally slower than the scan rate of the video, thereby requiring the video frame to be continuously refreshed. The second output signal from the video line pointer circuits 86 is a LAST LINE signal which indicates that the line desired to be printed or plotted corresponds to the last line of the video frame. The third output signal is called NEWDIFFFLD-.MADCTRCLK (new and different field AND memory address counter clock). The purpose of this signal will be described in more detail below. It should be noted at this point, however, that all three output signals from the video line pointer circuits 86 are forwarded to the control circuits 46, which latter circuits will also be described in detail below.

It should be understood at this point that the various signals depicted thus far in FIGS. 1 and 2 and to be depicted in FIGS. 3-9 are shown in only the "non-complement" state. However, as will become evident from the detailed circuit schematics of FIG. 10, various of such signals are actually present and utilized in both states, e.g. HS and $\overline{HS}$, or in just one state, e.g. HS or $\overline{HS}$. The depiction of only the non-complement state to describe the general block diagrams of FIGS. 1-9 is merely for simplicity and ease of comprehension.

Reference is now had to FIG. 3 where the video input circuits 42 depicted generally in FIG. 2 will be described. The video input circuits 42 include an a-c coupler 100 for coupling the selected COMP VIDEO signal from the video source multiplexer 38 to a non-linear input attenuator 102. The attenuator 102 attenuates the COMP VIDEO signal to a predetermined level due to the minimum gain of a video amplifier circuit 104 to which the COMP VIDEO signal is forwarded from the attenuator 102. The gain of the amplifier circuit 104 is controlled by an automatic gain control (AGC) circuit 106 connected to the output of the amplifier circuit 104 in order to maintain the voltage between the tip of each HS pulse in the COMP VIDEO signal and the backporch voltage level at a substantially constant value. The AGC circuit 106 is a sampling circuit that samples in response to timing control signals from the sync circuits 44. The AGC controlled COMP VIDEO signal is then forwarded from the output of the video amplifier circuit 104 to a video d-c restorer circuit 108. The d-c restorer circuit 108 uniquely offsets the d-c level of the COMP VIDEO signal in order to bring the backporch level to a predetermined reference potential which in the preferred embodiment, is one silicon junction voltage drop (controlled offset) above the common reference level of the system, e.g. ground potential. As indicated earlier, this reduces the likelihood of having common ground referenced noise adversly affect data sampling and detection processes.

The data detect circuits 52 depicted in FIG. 2 will now be described with reference to FIG. 4. The data detect circuits 52 include the video threshold detector 124 referred to above that receives the ANALOG VIDEO signal from the video d-c restorer circuit 108 (FIGS. 3 and 9) and generates a binary output signal that is high or low dependent upon whether or not the ANALOG VIDEO signal exceeds a predetermined threshold level. A high output corresponds to white and a low output to black. The binary output signal is applied to a data sampler 128 that is clocked by the SAMCLK signal from the SAMCLK circuits 54 (FIG. 2). The now DIGITAL VIDEO output of the data sampler 128 is forwarded through a controlled data inverter 130 where the signal is selectively inverted depending upon the state of the IMAGE signal generated by the control circuits 46 (FIG. 2). The DIGITAL VIDEO output of the inverter 130 is then forwarded to the serial-to-parallel converter 56, as mentioned above.

Reference is now had to FIG. 5 where the sync circuits 44 depicted in FIG. 2 will be described. The sync circuits 44 include a select circuit 156 for selecting between the COMP SYNC component of the COMP VIDEO signal applied at one input from the source multiplexer 38 (FIG. 2) and the COMP SYNC signal applied at another input from the video sources 12 (FIG. 1). The selected signal is then applied through a sync amplifier circuit 158 to a sync d-c restore circuit 160 where the sync tip level is restored to one diode drop below ground potential in order to facilitate stripping COMP SYNC from COMP VIDEO.

From the d-c restorer circuit 160, the selected signal is applied to a COMP SYNC stripper circuit 162 where the COMP SYNC portion of the COMP VIDEO signal, if selected, is detected out. The COMP SYNC output of the circuit 162 is forwarded to a timing control circuit 164, a vertical sync stripper circuit 166 and a horizontal sync stripper circuit 168. The timing control circuit generates the $\overline{WBP}$ and $\overline{WTIP}$ timing control signals described above. The vertical sync stripper circuit 166 separates from COMP SYNC the VS pulses, and the horizontal sync stripper circuit 168 separates from COMP SYNC the HS pulses and, in addition, generates the ESB (equalizing and serration pulse blanking) signal discussed above.

Reference is now had to FIG. 7 where the SAMCLK circuits 54 (FIG. 2) will be described. The SAMCLK circuits 54 include a SAMCLK select circuit 210 which selects either the PLL SAMCLK signal from the PLL circuits 84 (FIG. 2) or the EXT SAMCLK signal (if used) from the video sources 12 (FIG. 1). The selected SAMCLK signal is then forwarded to a phase corrector circuit 212 for bringing the selected SAMCLK signal into proper phase with the video data for accurate data sampling by the data sampler 128. The COMP VIDEO signal applied along the cable to the controller 10 causes a linear delay between its sync component and its data component. The selected SAMCLK signal (which is derived from the sync component) must be delayed by a like amount in order to bring it into phase with the video data.

Figure 6:
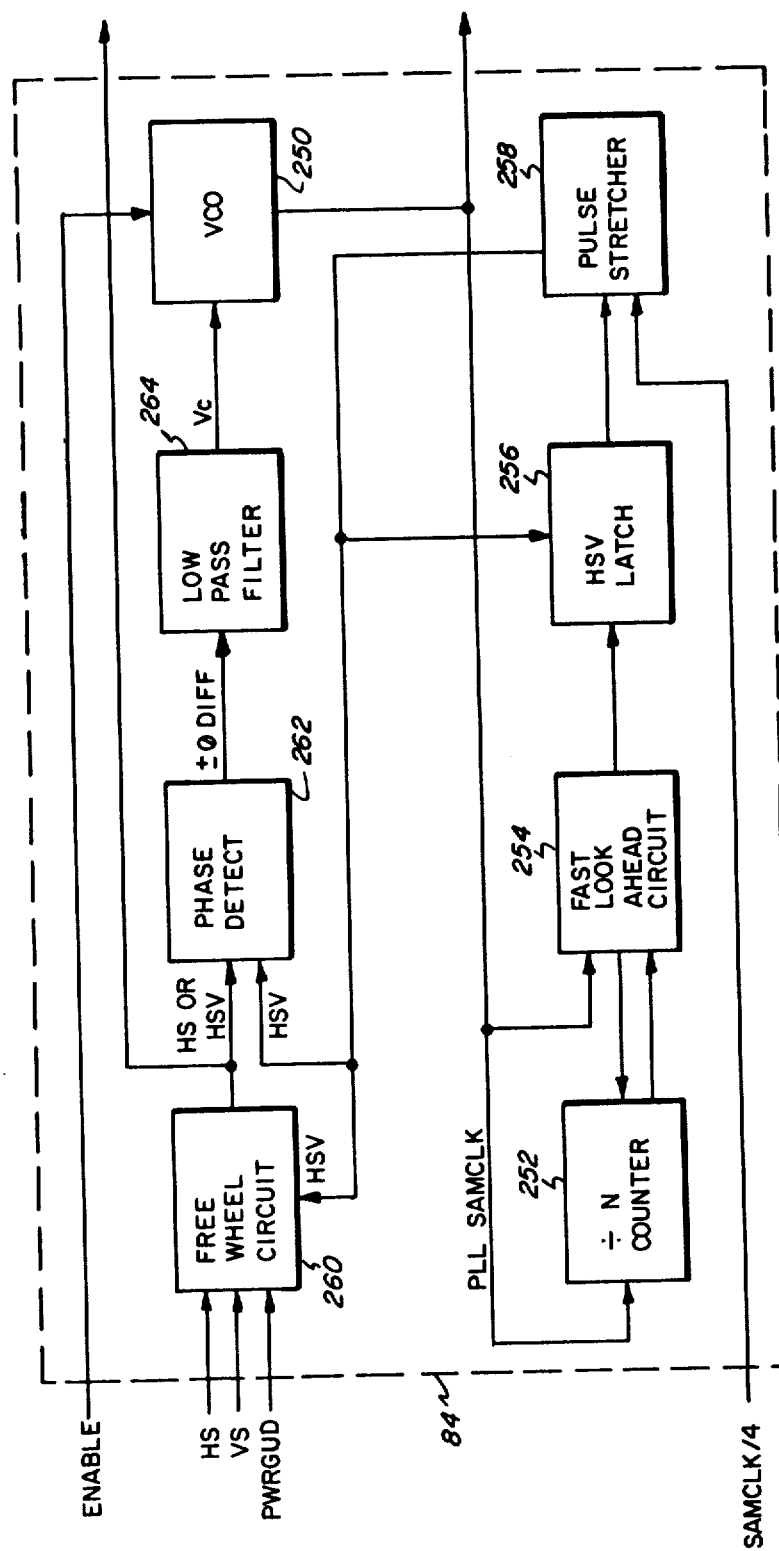
FIG. 6 is a schematic block diagram of the PLL circuits depicted in FIG. 2.

Reference is now had to FIGS. 6 and 10 where the PLL circuits 84 will be described. As stated above, the PLL circuits 84 when enabled generate the PLL SAMCLK signal having a frequency equal to a desired multiple (N) of the frequency of the HS pulses. Referring first to FIG. 6, the PLL circuits 84 include a variable frequency oscillator (VCO) 250 which is enabled by an ENABLE signal from the control circuits 46. The VCO 250 has a control input for receiving a control voltage Vc. When the voltage Vc is at zero volts, the VCO generates PLL SAMCLK at a frequency equal to N times the frequency of the HS pulses. The voltage Vc is actually an error voltage that may vary positive or negative in a manner and for reasons to be described below.

The PLL SAMCLK signal from the output of VCO 250 is not only supplied to the SAMCLK circuits 54, as discussed above, but is also forwarded to a ÷N counter 252 and to a fast look ahead circuit 254. The ÷N counter 252 divides the frequency of PLL SAMCLK by "N" which, as will be recalled, is equal to the multiple of the frequency of PLL SAMCLK relative to that of the HS pulses. The output of the ÷N counter 252 is fed through the fast look ahead circuit 254 which allows the ÷N counter 252 to operate synchronously at very high speeds while still permitting the requisite periodic loading of the "N" quantity into the counter 252. The output of the fast look ahead circuit 254 is forwarded to horizontal sync variable (HSV) latch 256 which generates a HSV signal having pulse spikes substantially at the frequency of HS. The HSV signal is applied through a pulse stretcher 258 which also receives a SAMCLK/4 signal from the control circuits 46. The pulse stretcher 258 expands the HSV pulses to a duty cycle substantially identical to that of HS. The HSV signal at the output of the pulse stretcher 258 is applied to an input of a free wheel circuit 260.

The free wheel circuit 260 also receives as inputs the HS and VS signals from the sync circuits 44 and a "power-good" (PWRGUD) signal from the control circuits 46. The function of the free-wheel circuit is to supply the signal HSV to a phase detector 262 during the vertical sync period when no HS pulses occur. During other periods than vertical sync, the HS signal is applied to the phase detector. During non-vertical sync periods, the phase detector 262 detects any phase differential between HS applied from the free-wheel circuit 260 and HSV applied from the pulse stretcher 258. This is the normal phase-locked-loop operation. If there is a phase-difference, a ±φDIFF signal is applied through a multi-pole low pass filter 246 where it is converted to the analog error voltage Vc discussed above.

The real benefit of the free-wheel circuit 260 is to be noted during the vertical sync period when HS pulses are not generated. Without circuit 260, this would initially result in a substantial error in phase that would momentarily greatly decrease the frequency of PLL SAMCLK. With circuit 260, however, HSV is substituted for the missing HS pulses during the vertical sync period, thereby enabling the PLL circuits 84 to "free-wheel" and continue to generate an acceptable PLL SAMCLK frequency.

Figure 10A:
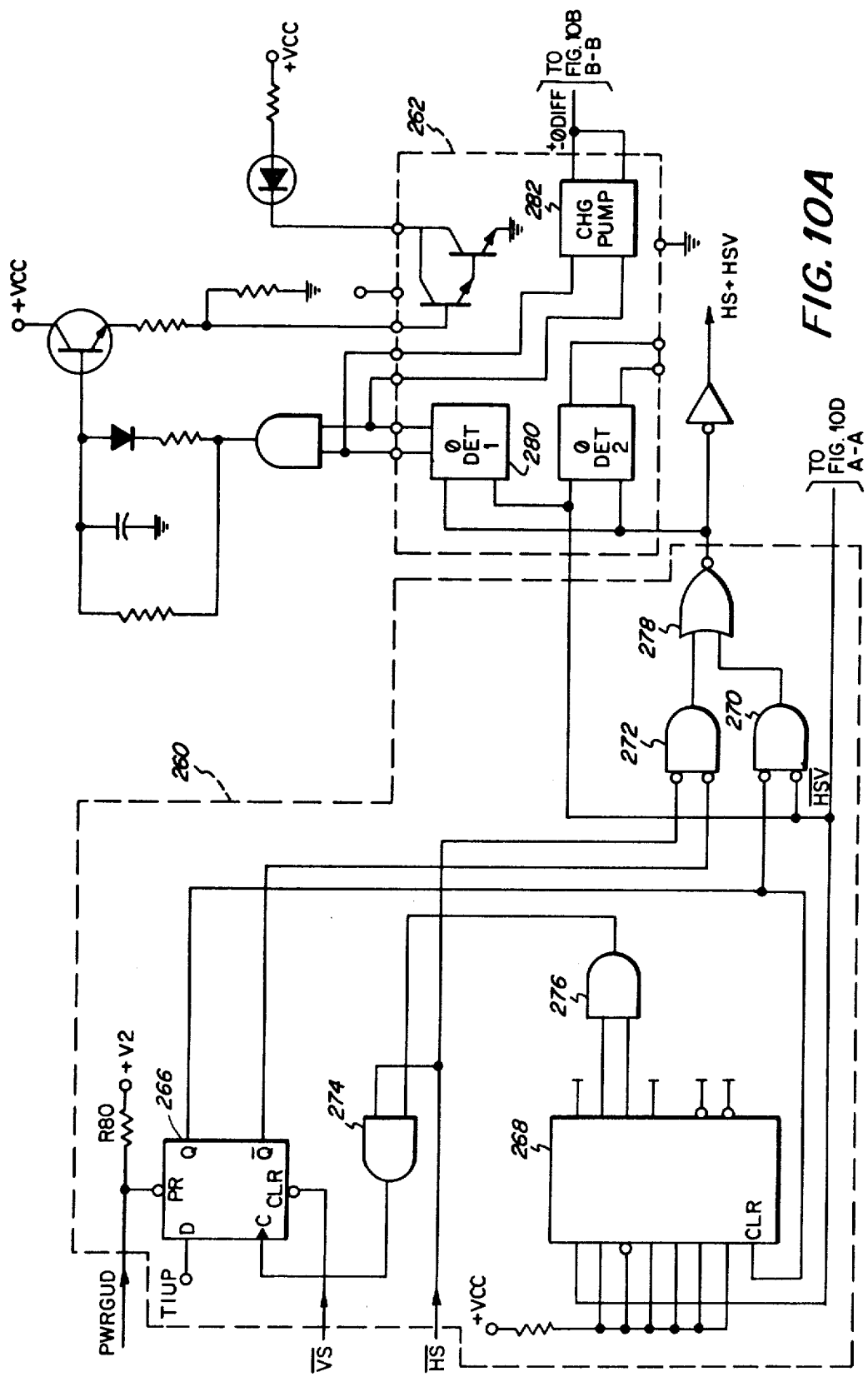
FIG. 10, comprised of FIGS. 10A-10D, is a detailed schematic circuit diagram of the PLL circuits of FIG. 6.

Referring now to FIG. 10A, the free-wheel circuit 260 includes a control flip-flop 266 of the D-type having its preset input connected to the control circuits 46 for receiving the PWRGUD signal and to supply voltage +V2 through a resistor R80. The reset input of flip-flop 266 is an inverted input terminal and is connected to the sync circuits 44 for receiving the $\overline{VS}$ signal. The Q output of flip-flop 266 is connected to the reset input of a conventional decoder 268, such as decoder SN 74192N manufactured by Texas Instruments or Motorola, and to one input of an inverted input AND-gate 270. The $\overline{Q}$ output of control flip-flop 266 is connected to one input of another inverted input AND-gate 272.

The second input of gate 270 is connected to the output of the pulse stretcher 258 for receiving the $\overline{HSV}$ signal, which signal is also applied to the clock input of the decoder 268. The second input of gate 272 is connected to the sync circuits 44 for receiving the $\overline{HS}$ signal therefrom. The $\overline{HS}$ signal is also applied to one input of an AND-gate 274, the other input of which is connected to the output of an AND-gate 276. Gate 276 is connected to two output terminals of the decoder 268 which will both be high at a count of six, there being six HS pulses per VS period. The output of gate 274 is connected to the clock input of flip-flop 266. Lastly, a NOR-gate 278 has its first input connected to the output of gate 272 and its second input connected to the output of gate 270. Its output, which is either $\overline{HS}$ or $\overline{HSV}$, is coupled to the video line pointer circuits 86 and the phase detector 262.

In operation, during a non-vertical sync period, $\overline{VS}$ will be high so that the $\overline{Q}$ output of flip-flop 266 will be low (the flip-flop 266 is reset at a low $\overline{VS}$ signal), thereby enabling gate 272 to pass the $\overline{HS}$ pulses to the phase detector 262 and the video line pointer circuits 86. At the same time, the Q output of flip-flop 266 will be high, thereby disabling the gate 270 and preventing the $\overline{HSV}$ from being gated through gate 270 to gate 278.

When the vertical sync period occurs, $\overline{VS}$ will go low, thereby resetting the flip-flop 266 and causing its $\overline{Q}$ output to go high and its Q output low. This will block gate 272 and enable gate 270 so that HSV is applied through gate 278. At the same time, the decoder 268 is reset and starts counting $\overline{HSV}$ pulses. When it reaches a count of six, corresponding to the multiple HS pulses potentially having post equalizing pulses in between, the output of gate 276 goes high, which enables the gate 274 to clock the flip-flop 266 at the occurrence of the first resuming $\overline{HS}$ pulse.

The $\overline{HS}$ or $\overline{HSV}$ signal at the output of gate 278 is applied to one input of phase detect circuit 262, while the signal $\overline{HSV}$ is applied to a second input of circuit 262 from the pulse stretcher 258 to be described in more detail below. The circuit 262 includes a conventional phase detector 280 and pump circuit 282 for generating a positive or negative phase difference signal (±φDIFF)) at the output of circuit 282. The ±φDIFF signal is applied through the low pass filter circuit 264 which preferably includes a conventional second order low pass filter.

Figure 10B:
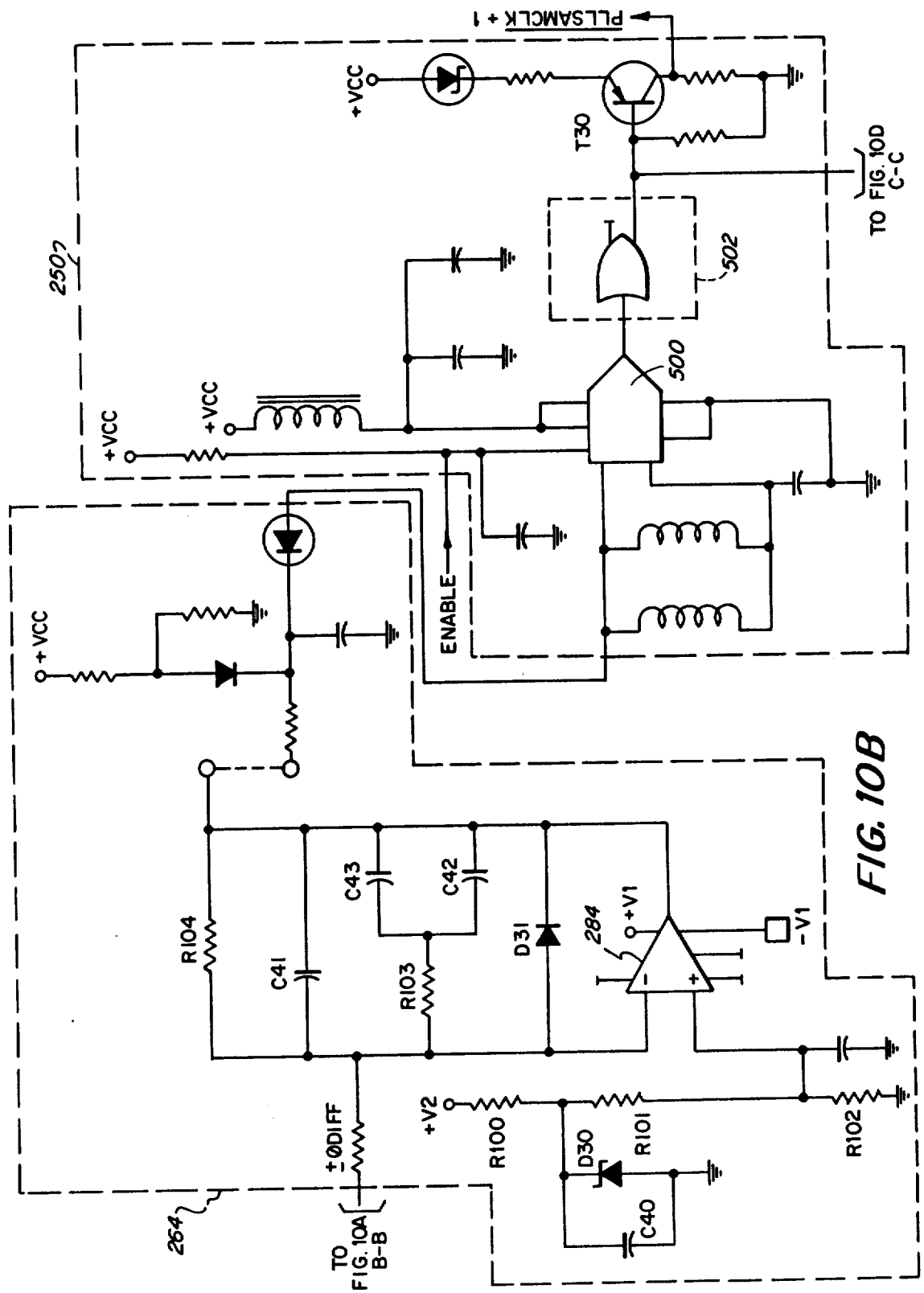

As shown in FIG. 10B, the low pass filter circuit 264 includes an amplifier 284 having its positive input connected to a voltage divider comprised of resistors R100, R101 and R102 connected in series between supply voltage +V2 and ground, with the positive terminal of amplifier 284 being connected between resistors R101 and R102. A capacitor C40 and diode D30 are connected in parallel between the junction of resistors R100 and R101, and ground. The negative input of amplifier 284 is connected to the anode of a diode D31, one side of a resistor R103, one terminal of a capacitor C41 and one side of a resistor R104. The output of amplifier 284 is connected to the cathode of diode D31, the other side of resistor 103 through a pair of capacitors C42 and C43 connected in parallel, the other terminal of capacitor C41 and the other side of resistor R104. The output of amplifier 284, which is the error voltage, Vc, is applied to the VCO 250.

The VCO 250 comprises entirely conventional circuitry, as depicted in FIG. 10B. More specifically, the VCO circuit 250 preferably includes an MC 1648P integrated circuit VCO chip 500 manufactured by Motorola which receives the Vc signal from the filter 264. Additionally, the circuit preferably includes an ECL buffer 502 for coupling the PLLSAMCLK output of the VCO chip 500 to the input base electrode of an output transistor T30 also included in the VCO circuit 250, as well as to the ÷N counter 252 and to the fast look ahead circuit 254. The VCO circuit 250 develops the $\overline{\text{PLLSAMCLK}}$ or a logic high at the output collector electrode of the output transistor T30.

Referring to FIG. 10C, the ÷N counter 252 includes conventional counter circuits 286, 288 and 290 which are programmed by switches 292, 294 and 296, respectively. The counter circuits each have their clock inputs connected to the VCO 250 for receiving the PLLSAMCLK signal. The PLLSAMCLK signal is effectively divided in frequency by the counter 252 by the factor "N" as defined above. The output of the counter 252 is actually applied through the fast look ahead circuit 254 which also provides back to the counter 252 various control signals.

Figure 10D:
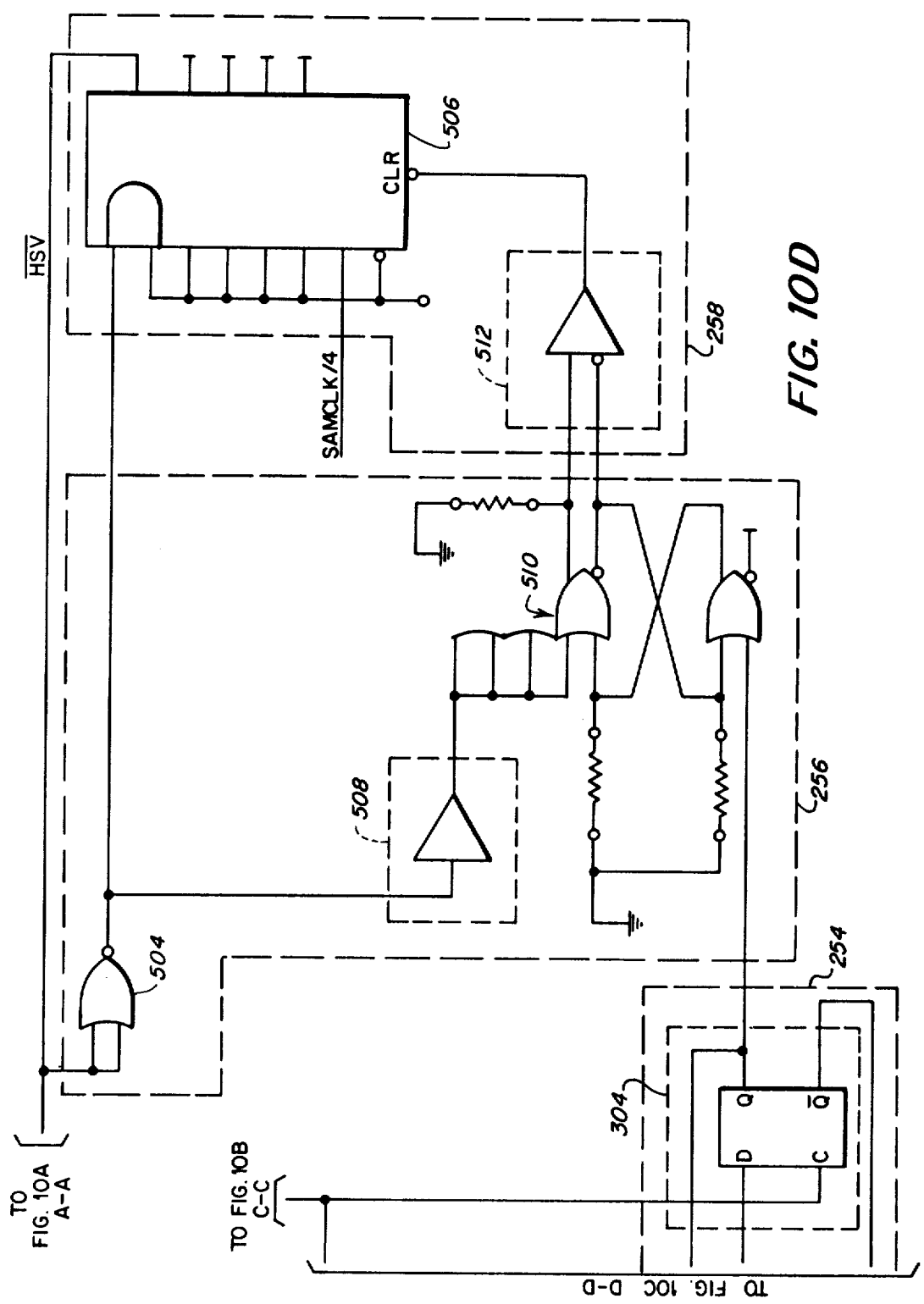

As shown in FIGS. 10C, and 10D the fast-look-ahead circuit 254 includes two AND-gates 298 and 300, a NAND-gate 302, and a pulse swallower flip-flop 304. By reason of the high speed and synchronism of the counter 252, it is necessary to "look-ahead" of the count to anticipate when the count is nearing the end, since an entire pulse time (i.e. the last pulse time) is required to load for the next cycle. The fast look ahead circuit 254 "consumes" the extra pulse used for loading such that the ÷N count entered on the ÷ adjustment switches actually matches the desired count instead of being off by one. The input of gates 298, 300 and 302 are connected to the various outputs of counting circuits 286, 288 and 290, as shown. The output of gate 298 resets counter circuit 288 and the output of gate 300 resets counter circuit 290. The output of gate 302 is connected to the data input of the flip-flop 304, the clock input of which is connected to the VCO 250 for receipt of PLLSAMCLK. The $\overline{Q}$ output is fedback to the set input of all three counter circuits 286, 288 and 290 for setting (loading) same. The Q output of flip-flop 304 is fedback to an input of the gate 302 and is also fed to the HSV latch 256.

The HSV latch 256 in combination with the pulse stretcher 258 comprises the conventional circuitry shown in FIG. 10D for shaping and expanding the duty cycle of the HSV signal so that the $\overline{\text{HSV}}$ signal developed at the output of the pulse stretcher 258 is substantially the same in waveform and duty cycle as the $\overline{\text{HS}}$ signal. The circuitry of latch 256 preferably includes an input inverter 504 for receiving the $\overline{\text{HSV}}$ signal from an output of a conventional decoder 506 included in the pulse stretcher circuit 258. The decoder 506 is preferably constituted by decoder SN 74161N manufactured by Texas Instruments or Motorola. The latch 256 further includes a TTL-to-MECL converter 508 that is preferably constituted by converter MC 12000P manufactured by Motorola and has its input connected to the output of the inverter 504. The output of converter 508 is connected through a cross-coupling output stage 510 to an MECL-to-TTL converter 512 included in the pulse stretcher 258. The converter 512 is also preferably constituted by Motorola converter MC 12000P. The output of converter 512 is applied to an inverted reset input of the decoder 506 in the pulse stretcher 258. Decoder 506 also receives the SAMCLK/4 signal on a second input line, it being recalled that a first input line is connected to the output of inverter 504.

Reference is now had to FIG. 8 wherein the video line pointer circuits 86 (FIG. 2) will be described. The video line pointer circuits 86 include first field select circuits 300 for generating an EVEN signal indicative of what the current field type is, i.e. odd (EVEN is low) or even (EVEN is high). The EVEN signal is supplied to a "new and different field" logic circuit 302 for a purpose to be described below. The first field circuits 300 also generate an Ff signal for application to printer-plotter wait logic 304. The Ff signal is basically a pulse signal having a frequency either equal to that of VS or VS/2, depending upon whether the video frame is refreshed at 1:1 repeat mode or 2:1 interlace mode. In this regard, the output of a 1:1 or 2:1 select circuit 306 is supplied as an input to the first field circuits 300. The first field circuits also receive as inputs a signal VERT from a VS one pulser 308, the signal ESB from the sync circuits 44, and a signal VE from a vertical pulse sync circuit 310. The signal VE is derived from the VERT signal in a manner to be described below.

The VS one pulser 308 receives as inputs SAMCLK/4 from the control circuits 46 and VS from the sync circuits 44. The signal VERT generated by the one pulser 308 is at the frequency of VS, but the duration of each VERT pulse is equal to that of each SAMCLK/4 pulse. It will be noted in FIG. 8 that the VERT signal is applied to the vertical pulse sync circuit 310, the new and different field logic 302 and a video top margin counter 312.

The vertical pulse sync circuit 310 responds to the VERT signal from the VS one pulser 308 and an ASHOLD signal from the control circuits 46 and generates the VE signal alluded to above. When the ASHOLD signal is true, the VE signal is held low so that none of the VERT pulses are manifest in the VE signal. When ASHOLD goes false, however, subsequent VERT pulses are manifest in the VE signal. As will be described in more detail below, the ASHOLD signal will be set high by the control circuits 46 during an initialization phase of operation. When this initial phase is completed, the ASHOLD signal is reset low.

The new and different field logic 302 is responsive to the EVEN signal above defined, as well as to a MADCNTRCLK signal from the control circuits 46, the VERT signal from the VS one pulser 308, the ASHOLD signal from the control circuits 46, an INENAB signal from the control circuits 46, and the output of the 1:1 or 2:1 select circuit 306. In response to such signals, the circuit 302 generates a NEWDIFFFLD.MADCNTRCLK signal for application to the control circuits 46. Basically, the circuit 302 generates a new and different field signal (NEWDIFFFLD) that is high when, and for so long as, each new field that is different from the previous field is being generated by the video sources 12. The signal EVEN represents the current field type and the signal INENAB enables the circuit 302. A memory address counter clock signal (MADCNTRCLK) is "ANDed" with NEWDIFFFLD by the circuit 302 and supplied as the NEWDIFFFLD.MADCNTRCLK signal to the control circuits 46 for a purpose to be described below.

The video line pointer circuits 86 also include an INDUN gated ÷2 circuit 312 which receives as inputs an INDUN signal from the control circuits 46 and the output from the 1:1 or 2:1 select circuit 306. The circuit 312 generates an IDf signal which is equal to INDUN or INDUN/2, depending upon whether 2:1 or 1:1 respectively is selected by circuit 306. Additionally, such signals are generated only after the ASHOLD signal is reset low. The INDUN signal represents a condition where an input control portion of the control circuits 46 has completed its sequence of operations.

The printer-plotter wait logic 304 receives as inputs a hard copy request signal (HCREQ) from the control circuits 46, the Ff signal from the first field circuits 300, the IDf signal from the INDUN gated ÷2 circuit 312, and the LAST LINE signal from a desired line counter 314 included in the video line pointer circuits 86. The printer-plotter wait logic 304 generates a count-up signal to the desired line counter 314 enabling some to increment one count during the pending of a true HCREQ signal. The count-up signal will only be issued when the printer-plotter 14 is ready to receive and print/plot the next line of video.

The video line pointer circuits 86 further include a current line counter 316 which keeps track of the current line count for each field of video data. A comparator 318 compares a first signal from the counter 314 representative of the desired line to be next printed or plotted and a second signal from the counter 316 representative of the current line being supplied from the video sources 12. When the comparator 318 detects a match, it issues a GET LINE signal to the control circuits 46 in order for that video line of data to be eventually supplied to the printer-plotter 14. The LAST LINE signal is generated by the counter 314 when the desired line is the last line of the field.

The current line counter is enabled by a top of visible raster ready signal (TOPRDY) generated by a video top margin counter 320 included in the video line pointer circuits 86. The number of invisible top margin lines per field can be adjusted by a count signal preloaded into the counter 320 from an adjustment circuit 322. Additionally, the number of video lines occurring before the sampling circuitry and the video line memory are actuated to receive the video data is determined by a top of margin adjustment signal applied to the counter 320 from another adjust circuit 324. The signal TOPRDY will go true when the requisite number of video lines have been counted before the first video line to be gathered in memory, i.e. the top of the visible raster, is counted. The current line counter 316 is incremented by the horizontal sync (HS) signal. This signal also increments the top margin counter 320.

A HORSY signal is generated from a HS one pulser circuit 326 which receives as inputs the HS or HSV signal from the PLL circuits 84 and the SAMCLK signal from the data detect circuits 52. The HORSY signal is basically a pulse signal where the pulse width is equal to one SAMCLK period during the period of an HS or HSV pulse.

Figure 9A:
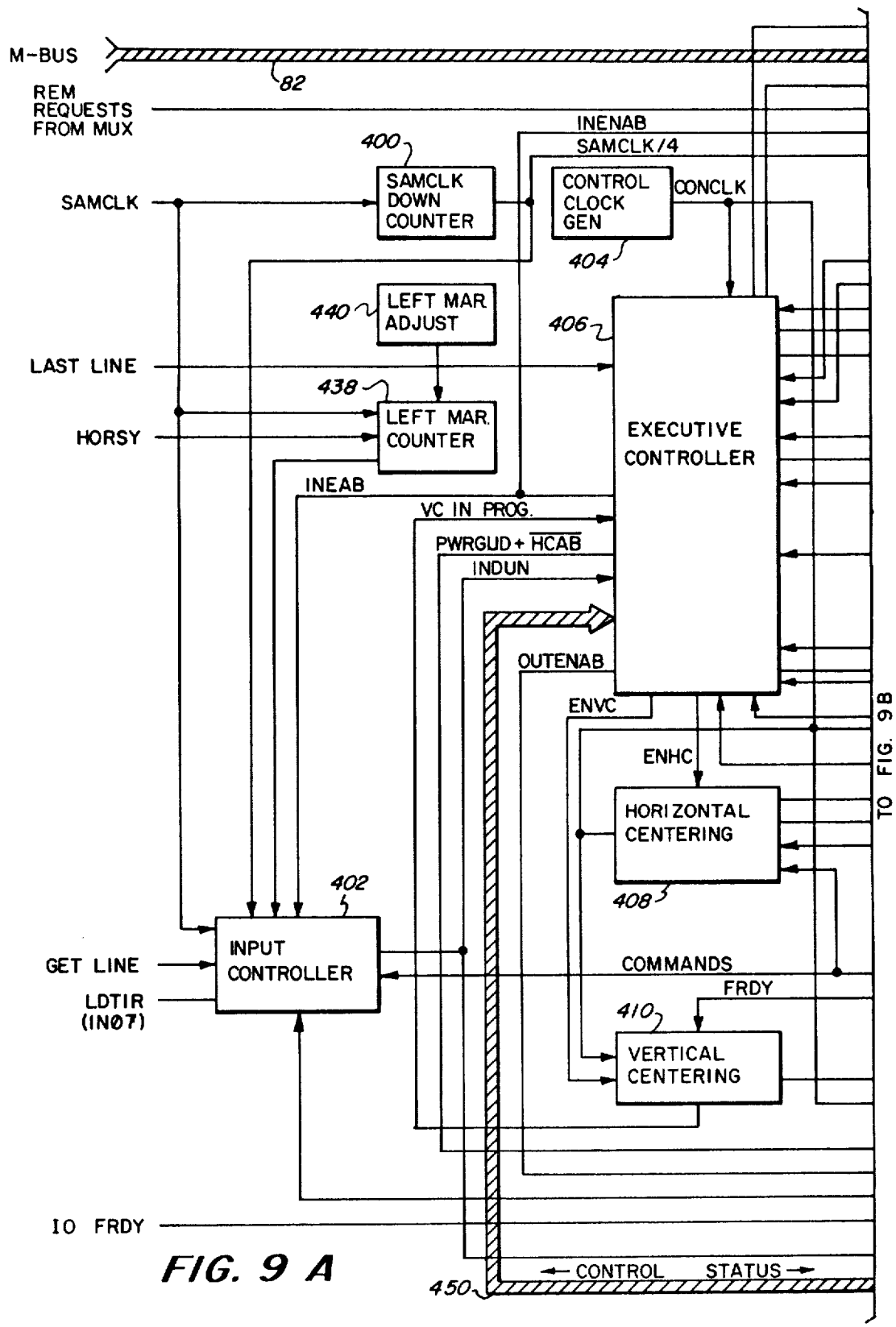
FIG. 9, comprised of FIGS. 9A-9C, is a schematic block diagram of the control and vertical expansion circuits of FIGS. 2.
Figure 9B:
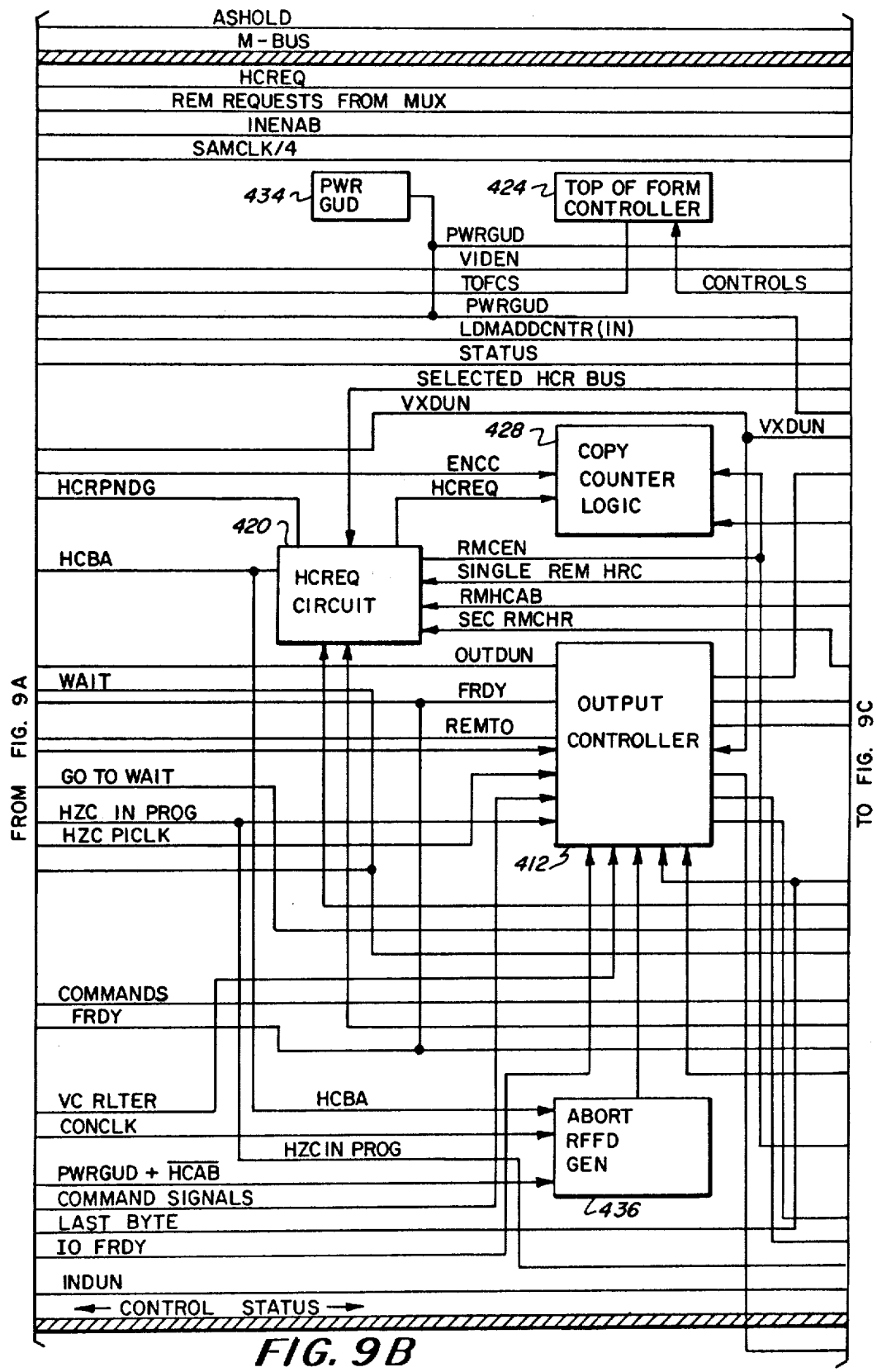
Figure 9C:
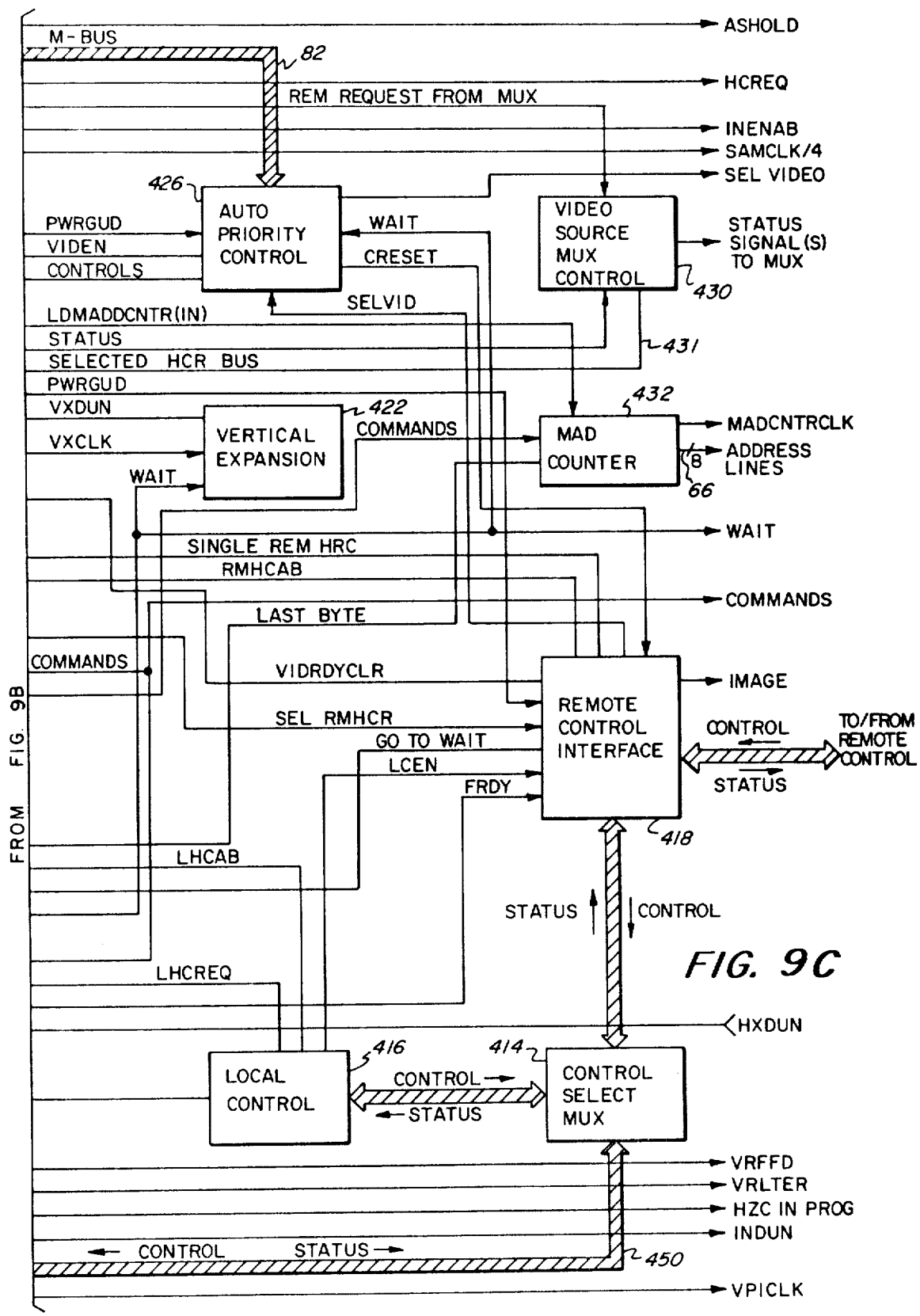

Reference is now had to FIG. 9 where the control circuits 46 (FIG. 2) will be described. As shown, the control circuits 46 include a SAMCLK synchronous down counter 400 which receives the SAMCLK signal from the data detect circuits 52 and divides that signal by a factor of "4", thereby producing the output signal SAMCLK/4. As mentioned above in connection with FIG. 8, the SAMCLK/4 signal is applied as an input to the VS one pulser 308. Additionally, and as shown in FIG. 9, the SAMCLK/4 signal is applied to an input controller 402 to be described below.

The control circuits 46 further comprise a control clock generator 404 which generates a CONCLK signal that is preferably at a frequency of 8 MHz, i.e. a clock pulse period of 125 ns. The CONCLK signal is applied to the clock input of an executive controller 406, a horizontal centering controller 408, a vertical centering controller 410, and an output controller 412, all of which will be described below.

Figure 11:
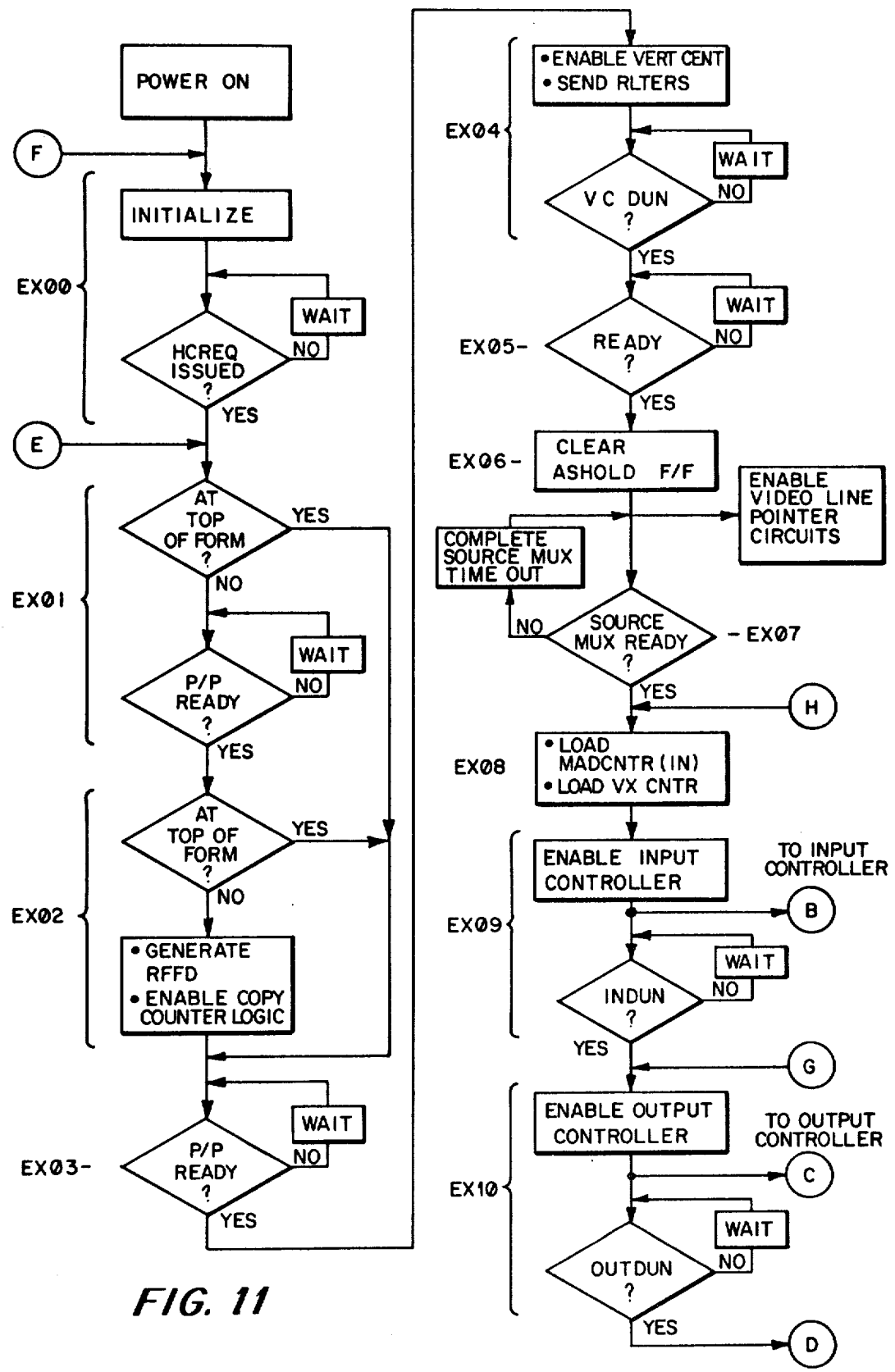
FIGS. 11-14 are flow charts depicting the operation of the video hard copy controller of FIGS. 2-10.
Figure 12:
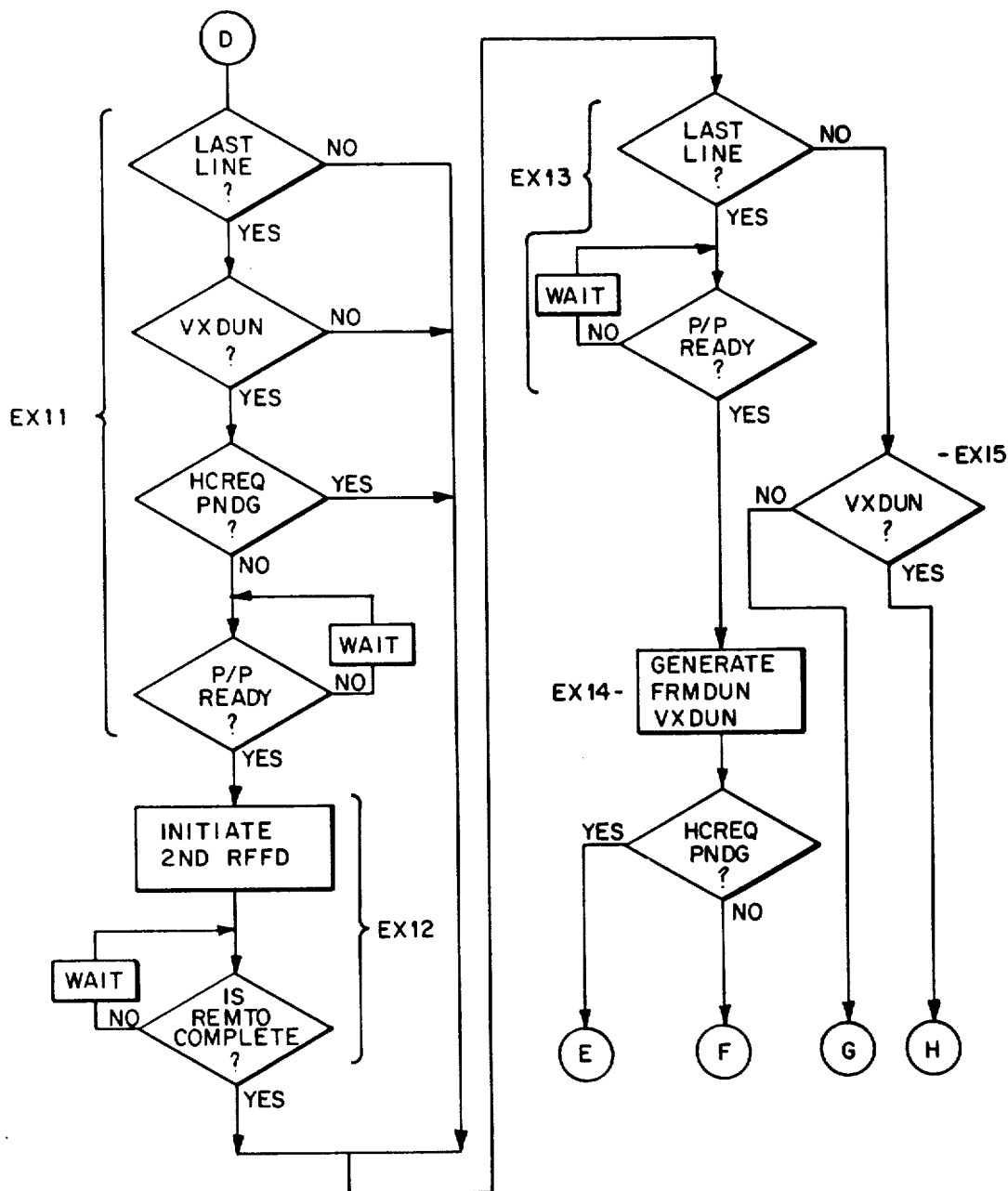

The executive controller 406 represents the heart of the control circuits 46 and has sixteen states to be described below in connection with FIGS. 11 and 12. The executive controller receives the following input signals:

(1) CONCLK—This signal is generated by the control clock generator 404.

(2) LAST LINE—This signal is generated by the desired line counter 314 (FIG. 8) and is true when that counter registers a count indicative of the last video line of each field.

(3) VC IN PROG—This signal is generated by the vertical centering controller 410 and is true when a vertical centering operation, to be described below, is being carried out.

(4) INDUN—This signal is generated by the input controller 402 and is true when an input control sequence carried out by the input controller has been completed.

(5) CONTROL SIGNALS—The executive controller 406 receives various control signals from a control select multiplexer 414. These control signals emanate either from a local control 416 or the remote control 34 (FIG. 1) as applied through a remote control interface 418.

(6) GO TO WAIT—This is a control signal emanating from the remote control 34; however, it is applied directly to the executive controller 406 from the remote control interface. As will be discussed below, the GO TO WAIT signal forces the executive controller into the wait state (EXϕϕ).

(7) REMTO—This signal, which stands for "remote function time-out," is generated by the output controller 412 to enable certain remote functions, e.g. form feed, line terminate, parallel input clock to printer/plotter (PICLK), to be completed.

(8) FRDY—This signal, which stands for "filtered ready," is true when the printer-plotter 14 to ready to receive the next line of video or a new forms command. The FRDY signal is generated by the output controller 412.

(9) OUTDUN—This signal is generated by the output controller 412 and is true when various operations carried out by the output controller and to be described below are completed.

(10) SRHCR—This signal, wihch stands for "selected remote hard copy request" is generated by a hard copy request (HCREQ) circuit 420. The SCHCR signal is either a selected one of the HCR signals applied to the control circuits 46 from the video source multiplexer 38 (FIG. 2), or a single remote HCR signal generated by the remote control 34, or a local HCR signal generated by the local control 416.

(11) HCAB—This signal, which stands for "hard copy request abort," is generated by the HCREQ circuit 420 in order to abort the HCREQ that is being or is about to be executed. A true HCAB signal will be generated when either a remote HCAB (RMHCAB) is issued by the remote control 34 through the remote control interface 418, or a local HCAB (LHCAB) is issued by the local control 416. Both RMHCAB and LHCAB signals are applied to the HCREQ circuit 420.

(12) HCRPNDG—This signal, which stands for "hard copy request pending," is also generated by the HCREQ circuit 420. This signal, when true, indicates that a HCREQ signal has been received by the HCREQ circuit 420.

(13) VXDUN—This signal, which stands for "vertical expansion done," is generated by a vertical expansion circuit 422. The vertical expansion circuit can be operated to vertically expand the hard copy fascimile of the video data printed/plotted by the printer/plotter 14. The signal VXDUN is true when a vertical expansion operation has been completed.

(14) TOFCS—This signal, which stands for "top of form command sent," is generated by a top of form controller 424 and goes true every time a MPICLK signal is received by automatic priority control circuits 426 which, among other functions, controls the top of form controller 424. The TOFCS signal, when considered in conjunction with FRDY, indicates that a "top of form" causing signal has been sent, the printer/plotter 14 went not ready to accomplish it, and that finally, the printer/plotter 14 resumed the "ready" status again indicating that "top of form" was indeed accomplished. The MPICLK signal stands for "matrix parallel input clock" and is generated along the M-bus 82 from the data select multiplexer 74 (FIG. 2) along with other control signals. The purpose of MPICLK signal is to clock a line of video data from the data select multiplexer 74 into the printer-plotter 14. The top of form controller 424 and auto priority control circuits 426 will be described in more detail below.

(15) PWRGUD—This signal is generated by a power good circuit 434 and is true when each and all of the multiple power supply voltage levels are at proper levels.

(16) VIDEN—This signal, which stands for "video enable", is generated by the auto priority control circuits 426 and is true when data originating from the video sources 12, as opposed to that originated from the CPU 24, is to be forwarded to the printer-plotter 14.

Having described the various input signals to the executive controller 406, the output signals therefrom will be described and include:

(1) INENAB—This signal stands for "input enable" and is forwarded to the input controller 402 during a branch from the executive controller routine at state 9 (EXφ9) in order to enable the input controller 402 to execute the operations of its routine, i.e. the general extracting of video data.

(2) ENHC—This signal stands for "enable horizontal centering" and is forwarded to the horizontal centering controller 408 at state 4 (EXφ4) of the executive controller routine in order to enable horizontal centering to be performed.

(3) WAIT—This signal is forwarded to the horizontal centering controller 408, the vertical expansion circuits 422, the auto priority control circuits 426, and along one of control lines 76 (FIG. 2) to the data select multiplexer 74 to disable same. The WAIT signal goes true at state EXφφ of the executive controller, as will be discussed later.

(4) ENCC—This signal stands for "enable copy counter" and is forwarded to an optional copy counter logic circuit 428 to increment same. The ENCC signal goes true at state EXφ2 of the executive controller 406.

(5) STATUS signals are forwarded to a video source multiplexer control circuit 430 for application to the video source multiplexer 38.

(6) LDMADCNTR(IN)—This signal stands for "load memory address counter input" and is forwarded to a memory address counter 432 which supplies the 8-bit (byte) address along lines 66 to the video line memory 64. The LDMADCNTR(IN) goes true at executive controller state EXφ8 and causes an initial starting address to be forwarded to the video line memory 64.

(7) PWRGUD+$\overline{HCAB}$—This combined signal should be considered by its parts, PWRGUD and $\overline{HCAB}$. PWRGUD is an initialization signal firstly and a status signal secondly. In the latter case, PWRGUD will initiate a printer/plotter form feed should any power voltage be lost. The same is accomplished on an abort signal, $\overline{HCAB}$. $\overline{HCAB}$ is just that, a means to deliberately initiate a return to WAIT state in the controller and also causes the printer/plotter 14 to advance to the next top of form. The PWGUD and $\overline{HCAB}$ are combined since their results eventually become common.

(8) HCREQ—this hard copy request signal is applied to the video line pointer circuits 86, as mentioned above.

(9) ASHOLD—This signal stands for asynchronous hold and goes true during the initialization state of the executive controller, i.e. from states EXφφ-EXφ5. The ASHOLD signal, as will be recalled, holds the flip-flop 382 of printer-plotter wait logic 304 reset, thereby allowing the counter 314 to count the first line. Also, it basically allows for all printer/plotter forms control activities, i.e. vertical centering, etc., to be completed "off line," prior to becoming synchronous, i.e. "locking to" the incoming video signal to be sampled.

The input controller 402 has the primary function of controlling the serial-parallel converter 56 and the temporary input register 58. The serial-parallel converter 56 is controllerd in a manner whereby it forms 8-bit bytes of video line data in parallel format for application into the register 58 and then into the video line memory 64 until an entire line of video data is gathered in the memory 64. The input controller 402 receives the following input signals:

(1) SAMCLK—This signal is received from the data detect circuits 52.

(2) SAMCLK/4—This signal is received from the synchronous SAMCLK down counter 400.

(3) INENAB—This is a cuing signal received from the executive controller 406 and enables the input controller 402 to execute its eight states.

(4) HORSY—This signal is received from the HS one pulser circuit 326 in the video line pointer circuits 86 (FIG. 8).

(5) GET LINE—This signal is received from the comparator 318 of the video line pointer circuits 86.

(6) LAST BYTE—This signal, which is true when the last byte of a video line is loaded into the memory 64, is received from the memory address counter 432.

(7) LFTRDY—This signal is generated from a left margin counter 438 indicating that the desired left margin, determined by a left margin adjust circuit 440, has been reached.

The following output signals are generated by the input controller 402:

(1) INDUN—This signal is forwarded to the executive controller 406 as indicated above, and its complement $\overline{INDUN}$ is forwarded to the INDUN gated ÷2 circuit 312 of the video line pointer circuits 86. The INDUN and $\overline{INDUN}$ signals will go true during the last byte time after the input controller has executed its eighth state (INφ7), i.e. issued a LDTIR command.

(2) LDTIR—This signal stands for "load temporary input register" and causes the input register 58 to be parallel loaded with the just gathered 8-bit byte of video data from the serial-parallel converter 56.

The INENAB, GET LINE and LFTRDY signals enable the input controller, the SAMCLK and SAMCLK/4 signals clock the input controller, the LDTIR signal (INφ7) causes INDUN signal to go true, and the LAST BYTE signal disables the input controller. The input controller operating on a pixel or bit basis executes its eight states upon a branch from the executive controller routine, and returns to the executive controller routine following execution of state IN$\phi$7.

The left margin counter 438 is preset to a predetermined count as established by the left margin adjust circuit 440. The input controller 402 will not be enabled to control the serial to parallel converter 56 and input register 58 in the manner above-described until the number of video bits entering the converter 56 at the start of each new video line exceeds by one the count preset in the counter 438, thereby establishing a desired left margin.

Still referring to FIG. 9, the horizontal centering circuit 408 has the function of centering the printed/plotted page of video data in a horizontal direction. In this regard, the circuit 408 includes a counter (not shown) that is preset to a predetermined maximum count by an adjustment circuit (also not shown) in a manner similar to the left margin adjustment circuit 440. The horizontal centering circuit 408 is clocked by the CONCLK signal supplied thereto from the control clock generator 404. The circuit 408 is enabled by true ENHZC (OUT$\phi\phi$) and FRDY signals from the output controller 412 and is disabled by either the WAIT signal from the executive controller 406 or a DISHZC signal (EX$\phi$1) from the executive controller.

As soon as the horizontal centering circuit 408 is enabled by ENHZC, a HZC IN PROG (horizontal centering in progress) signal is applied by the circuit 408 to the output controller 412. The horizontal centering circuit 408 also generates a HZC PICLK (horizontal centering parallel input clock) signal that is applied to the output controller and concurrently forces all zero bytes of data at the data select multiplexer 74. As mentioned above, the "PICLK" (parallel input clock) signals are used to load video line data from the data select multiplexer 74 (FIG. 2) to the printer-plotter 14.

The vertical centering circuit 410 has the function of centering the printed/plotted page of video data in a vertical direction in a manner very similar to the horizontal centering circuit 408. The vertical centering circuit 410 is enabled by a true ENVC (EX$\phi$4) signal from the executive controller 406 and a true FRDY signal from the output controller 412. When enabled, it generates a VC IN PROG (vertical centering in progress) signal that is applied to the executive controller 406. The vertical centering circuit 410 also generates a VCRLTER (vertical centering remote line terminate) signal that is applied to the output controller 412 for causing the termination of video line transmittals to the printer-plotter to print-plot multiplicities of zero data lines, thereby accomplishing the desired vertical centering.

The HCREQ circuit 420 alluded to above is capable of receiving four different hard copy request signals, i.e. (1) SELECTED REM HCR from the video source multiplexer control 430 via bus 431, (2) SELECTED LOCAL HCR from the video source multiplex control 430 via bus 431, (3) SINGLE REMHCR from the remote control interface 418, (4) LHCREQ from the local control 416. Receipt by any of these will cause a HCRPNDG (hard copy request pending) signal to be generated and applied to the executive controller 406. Additionally, a HCREQ signal will be applied to the copy counter logic 428 for loading it with the copy quantity. If any hard copy request signal is received, it is applied as a status signal (VIDRDY) to the remote control 34 through the remote control interface 418.

The HCREQ circuit 420 also is capable of receiving RMCEN (remote control enable) and LHCAB (local hard copy abort) signals from the local control 416. Further, it is capable of receiving a RMHCAB (remote hard copy abort) signal from the remote control interface 418. If either a true LHCAB or RMHCAB signal is received, a HCAB signal is generated and applied to the executive controller 408.

The copy counter logic 428 has the function of determining the number of copies of each video frame that are to be made by the printer-plotter 14. The copy counter 428 loaded by any HCREQ signal from the HCREQ circuit 420 and is clocked by the ENCC (EX$\phi$2) signal from the executive controller 406. The selected number of copies may be determined remotely via remote control interface 418, or locally from operator control. The choice of local or remote control is determined by the state of the RMCEN signal from the local control 416.

The output controller 412 has the main function of sending data from the video line memory 64 (FIG. 2) to the printer-plotter 14. The output controller 412 generally operates on a byte basis, fetching bytes from memory, expanding them as selected, attending to forms control, and then repeating the operation until each line is completed.

Specific operations include initiating a DATA PICLK (data parallel input clock) signal that is "ORed" with the HZC PICLK referred to previously to define a VPICLK (video parallel input clock) signal that is forwarded to the data select multiplexer 74 along a control line 76 (FIG. 2) in order to load a line of video data into the printer-plotter 14. Another operation is to initiate a DATARLTER (data remote line terminate) signal that is "ORed" with the VC RLTER signal alluded to above. The resultant VRLTR signal is forwarded to the data select multiplexer 74. The horizontal expansion function of the output controller 412 basically encompasses (1) the fetching of a byte from the video line memory 64, and (2) replication on a bit-by-bit basis of adjacent bits in integer multiplicities so as to attain the desired horizontal expansion factor for each printer/plotter data line. Similarly to the VRLTER generation, the output controller initiates a DATAFFD (data form feed) signal that is "ORed" with other "RFFD" signals to develop a VRFFD (video remote form feed) signal that is forwarded to the data select multiplexer 74.

The output controller 412 receives the following input signals:

(1) CONCLK—from the control clock generator 404 for clocking the output controller.

(2) HZC PICLK—from the horizontal centering circuits 408 for the reasons previously described.

(3) Executive controller commands—Among these command signals are MRES, TOFRFFD+2nd RFFD (top of form remote form feed OR second remote form feed), and OUTEN (output controller enable—EX1$\phi$).

(4) HZC IN PROG—from the horizontal centering circuits, as mentioned above.

(5) VC RLTER—from the vertical centering circuits, as mentioned above.

(6) HCABFF (hard copy abott form feed)—from the abort remote form feed generator 436.

(7) LAST BYTE—from the memory address counter 432.

(8) VXDUN (vertical expansion done)—from the vertical expansion circuits 422.

(9) IO FRDY—This signal, which stands for "input-output filtered ready" is supplied from the data select multiplex 74.

HXDUN (horizontal expansion done)—from the horizontal expansion circuits 70. This signal allows the fetching of the next memory byte from the video line memory 64 and replication of it to expand data horizontal.

The following output signals are generated by the output controller 412:

(1) OUTDUN—This signal is supplied to the executive at output state six (OUT$\phi$6) and goes true only if the LAST BYTE signal is true.

(2) FRDY—This signal is supplied to the executive controller 406, the vertical centering circuits 410 and the remote control interface 418.

(3) REMTO—As discussed earlier, this signal is supplied to the executive controller 406.

(4)–(6) VRFFD, VRLTER, VPICLK—As indicated above, these three signals are supplied to the data select multiplexer 74.

(7) output commands—Various output command signals, such as LDMADCNTR (OUT) and UPDATE MADCNTR (OUT) are supplied to the memory address counter 432 at output controller states OUT$\phi\phi$ and OUT$\phi$7, respectively. Other output commands at states OUT$\phi\phi$, OUT$\phi$1 and OUT$\phi$6 are forwarded to the horizontal expansion circuits 70. The output command at state OUT$\phi\phi$ is also forwarded to the horizontal centering circuit 408 and to the input controller 402, as mentioned above.

The auto priority controller 426 has the main function of establishing priority between video data supplied to the controller 10 from the video sources 12 and CPU data supplied to the controller 10 from the CPU 24. The controller 426 samples the data present in the data select multiplexer, as applied thereto along the M-bus 82. If when the printer/plotter 14 is not in use and the video data is received by the data select multiplexer first, the auto priority control issues a VIDEN command to the executive controller 406. The executive controller is then enabled to carry out its operations relative to the video data. The output controller will issue appropriate video commands as discussed above to the data select multiplexer enabling the video data to be relayed to the printer-plotter 14. The CPU 24 may interrupt a video copy in progress only by issuing a remote reset command on bus 26 via the M-bus 82 which causes an immediate return to the wait state.

If, when the printer/plotter 14 is not in use, and CPU data is received by the data select multiplexer 74 first, the auto priority controller 426 retains the use status of the printer/plotter being given to the CPU, and prevents VIDEN from going true until the CPU terminates its use, such being detected by a selectable CPU control signal, such as EOT (end of transmission). By use and control of a selection means, a HCREQ signal may interrupt the CPU use of the printer/plotter 14 depending upon the selection of the terminating CPU signal.

The auto priority control 426 can be locally commanded via operator switches in the local control 416, or can be remotely commanded via the remote control interface 418 to select the video data instead of the CPU data by a SEL VID (select video) signal received through the remote control interface 418. A SEL VIDEO status signal is then forwarded to the data select multiplexer 74 for effecting the video data selection. The auto priority control 426 also receives a PWR GUD input signal from the power good circuit 434 and a WAIT signal from the executive controller 406 for initialization or for termination. The WAIT signal will cause VIDEN to go false. The auto priority control also sends appropriate control signals to the top of form controller 424 in order to control generation of the signal TOFCS thereby, as described above.

The vertical expansion circuits 422 form part of the general control circuits 46, unlike the horizontal expansion circuits 70 connected directly to the output of the video line memory 64 (FIG. 2). The vertical expansion circuits 422 can be preset to a desired amount of expansion by a select circuit (not shown). The vertical expansion circuits are clocked by the VXCLK from the output controller 412 and are reset and disabled by the WAIT signal from the executive controller 406. When the desired vertical expansion operation has been completed, the VXDUN signal that is applied to the output and executive controllers goes true.

The video source multiplexer control 430 is capable of receiving any one or more of the remote hard copy request signals generated by the video sources 12. The first remote HCREQ signal received is selected and forwarded to the HCREQ circuit 420. The control circuit 430 sends a status signal back to the video source multiplexer 38 informing it which HCREQ signal has been selected in order for the multiplexer 38 to forward only the video signals from the video source 12 that initiated the selected HCREQ to the controller 10. The control circuit 430 also relays various status signals from the executive controller to the video source multiplexer 38.

The memory address counter 432 receives the LDMADCNTR(IN) signal from the executive controller 406, and the LDMADCNTR (OUT) and UPDATE MADCNTR signals from the output controller 412. The memory address counter 432 is preset to a predetermined count (indicative of the total number of bytes per video line) upon receipt of the LDMADCNTR(IN) signal. The counter is clocked by the MADCNTRCLK signal which is derived from the UPDATE MADCNTR signal and is "unloaded" to supply on 8-bit address to the video line memory 64 upon receipt of a true LDMADCNTR (OUT) signal. The counter also supplies the MADCNTRCLK to the video line pointer circuits 86, as mentioned above.

The primary function of the remote control interface circuits 418 is to relay control signals from the remote control 34 to the control select multiplexer 414, except for the control signal GO TO WAIT which is supplied directly to the executive controller 406, and the control signal IMAGE which is supplied directly to the data detect circuits 52, as discussed above. The interface 418 also relays status signals from the control select multiplexer 414 to the remote control 34. Other status signals, such as SEL RMHCR from the local controland FRDY from the output controller 412 are also relayed to the remote control 418.

The control select multiplexer 141 not only receives remote control signals through the interface 418, but also receives local control signals from the local control 416. The multiplexer 44 selects the first set of control signals received and transmits them along an output bus 450 to the executive controller 406. However, status signals from the executive controller are fed back to both the local control 416 and the remote control interface 418, regardless of which was earlier selected.

The overall operation of the video hard copy controller 10 will now be described with reference to the operational flow charts of FIGS. 11-14. Referring first to FIG. 11, following power turn on, the controller 10 executes certain initialization routines as follows: (1) it issues a PWRGUD status signal if and when the proper power supply levels have been attained, (2) it starts the PLL VCO 250 (3) it forces the executive controller 406 into the WAIT state (EX$\phi\phi$), and (4) it sets an ASHOLD flip-flop (not shown) included in the executive controller circuits.

Following these initialization routines, the controller 10 looks to see whether a HCREQ signal has been issued by either a video source 12 (SELECTED REM HCR), the remote control 34 (SINGLE REM HCR), the local control 416 (LHCREQ) or the multiplexer control 430 (SELECTED LOCAL HCR). If any of these signals are true, the HCRPNDG signal supplied by the HCREQ circuit 420 to the executive controller 406 will go true. If no hard copy request signal had been issued and received by the HCREQ circuit 420, so that HCRPNG will be false, the executive controller 406 stays in the WAIT state (EX00) until a HCREQ is issued and received.

Once the controller 10, via HCREQ circuit 420, detects an issued HCREQ signal, the resultant true HCRPNDG signal will allow CONCLK to step the executive controller 406 into its state-one (EX$\phi$1) where the controller 406 looks to see if the printer-plotter 14 is at top of form. This is accomplished by detecting the state of TOFCS transmitted to the executive controller 406 by the top of form controller 424. If TOFCS is false, the executive controller looks to see whether the printer-plotter 14 is ready to receive a remote form feed signal. This is accomplished by examining the state of the FRDY signal from the printer/plotter 14 via the output controller 412. If FRDY is false, the executive controller waits until it goes true. When this occurs, the executive controller is clocked to its state two (EX$\phi$2), to be described below. If TOFCS was true when it was first detected, instead of false, the executive controller would skip state two and go to state three (EX$\phi$3).

At state two (EX$\phi$2), the executive controller 406 looks to see whether TOFCS is true. If not, it generates a RFFD signal that causes a VRFFD signal to be applied from the output controller 412 through the data select multiplexer 74 along the bus 22 to the printer-plotter 14, and also loads the desired count quantity into the copy counter logic 428 by raising the ENCC signal. Following these operations, the executive controller is clocked to its state three (EX$\phi$3) wherein it waits for FRDY to be true in anticipation of issuing RLTER signals for vertical centering. When this occurs, the executive controller is clocked to its state four (EX$\phi$4).

At state four (EX$\phi$4), the executive controller first raises the ENVC signal to enable the vertical centering circuits 410, and then generates RLTERS signals that cause VRLTER signals to be applied from the output controlelr 412 through the data select multiplexer 74 along the bus 22 to the printer-plotter 14. All printer/plotter data lines are held to zero data during vertical centering. Following these operations, the executive controller waits until VCDUN goes true. When this occurs, the executive controller is clocked to its state five (EX$\phi$5) where it waits for FRDY to go true in anticipation of sending data to the printer/plotter. When FRDY goes true, the executive controller 406 advances to its state six (EX$\phi$6) where it resets its ASHOLD flip-flop, thereby enabling the video line pointer circuits 86, as described above. The general operation of the video line pointer circuits 86 has been described above and will, therefore, not be repeated at this point, except to note that all controllers synchronize to the incoming video signal at this point in time.

After the ASHOLD flip-flop is reset, the executive controller advances to its state seven (EX$\phi$7) where it looks to see if the video source multiplexer 38 is ready. If not, it waits a predetermined time out and again looks to see if the multiplexer 38 is ready. The waiting period is required for the controller 10 to lock/synchronize to the new currently connected video source signal. If yes, the executive controller advances to its state eight (EX$\phi$8) where it issues a LDMADCNTR(IN) signal that is forwarded to the memory address counter 432 in order for the predetermined total byte count to be preset into the counter. Additionally, the counter (not shown) in the vertical expansion circuits 422 is preset in a like manner and as described above. Following these operations, the executive controller 406 advances to its state nine (EX$\phi$9).

At state EX$\phi$9, the executive controller enables the input controller 402 by issuing a true INENAB signal. This signal is also applied to the video line pointer circuits 86, as will be recalled. The main sub-routine executed by the input controller has the primary function of creating 8-bit bytes of video data and will be described in more detail below with reference to FIG. 12. While the input controller is running through its states, the executive controller remains in state EX$\phi$9 waiting for a true INDUN signal from the input controller at its state eight (IN$\phi$8). As soon as INDUN goes true, the executive controller advances to its state ten (EX1$\phi$). Thus, the input controller may be thought of as a sub-routine branch of the main executive controller, but operates at very high speed.

At state EX1$\phi$, the executive controller 406 issues a true OUTENAB signal in order to enable the output controller to execute the states of its routine. This routine will be described below in connection with FIG. 14. While the output controller is executing its routine, the executive controller is held in state EX1$\phi$ waiting for OUTDUN to go true. When this finally occurs, the executive controller advances to its state eleven (EX11).

At state EX11, the executive controller 406 first looks to see whether the current video line of the field that is being gathered in the video line memory 64 is the last line. This is accomplished by sampling the state of the LAST LINE signal supplied to the executive controller by the video line pointer circuits 86. If LAST LINE is true, the executive controller next looks to see if VXDUN is true, i.e. have the vertical expansion circuits 422 completed their operation. If VXDUN is true, the executive controller next looks to see if HCREQ PNDG is true. If not, the executive controller waits for FRDY to go true. When this occurs, the executive controller advances to its state twelve (EX12). If either LAST LINE was false, or VXDUN was false or HCREQ PNDG was true, then the executive controller skips state twelve and advances to state thirteen (EX13).

During state twelve (EX12), if not skipped, the executive controller initiates a second remote form feed by raising the signal 2nd RFFD that is applied to the output controller circuits in order for VRFFD to be applied through the data select multiplexer 74 to the printer-plotter 14. Following this operation, the executive controller waits a predetermined remote function time-out by waiting until the signal REMTO, applied to the executive controller from the output controller, goes true. When this occurs, the executive controller advances to its state thirteen (EX13).

In state thirteen (EX13), the executive controller first looks to see whether LAST LINE is true. If not, it skips states thirteen and fourteen to state fifteen (EX15) where it looks to see if VXDUN is true. If not, it returns to state ten (EX1$\phi$) of the executive controller. If VXDUN was true, the executive controller returns to its state eight (EX$\phi$8). Now then, if LAST LINE was true instead of false during EX13, the executive controller waits for FRDY to go true and then advances to its state fourteen (EX14).

At state fourteen (EX14), whenever LAST LINE occurs the executive controller 406 causes the FRMDUN and VXDUN signals to go true and then looks to see if HCREQ PNDG is true. If HCREQ PNDG is true, the executive controller returns to its state one (EX$\phi$1); whereas if it isn't the executive controller returns to its state zero (EX$\phi\phi$). Upon return to EX$\phi$1, another single copy is made by repeating another executive controller cycle, each repeat process decrementing the copy counter until all copies requested are completed.

Figure 13:
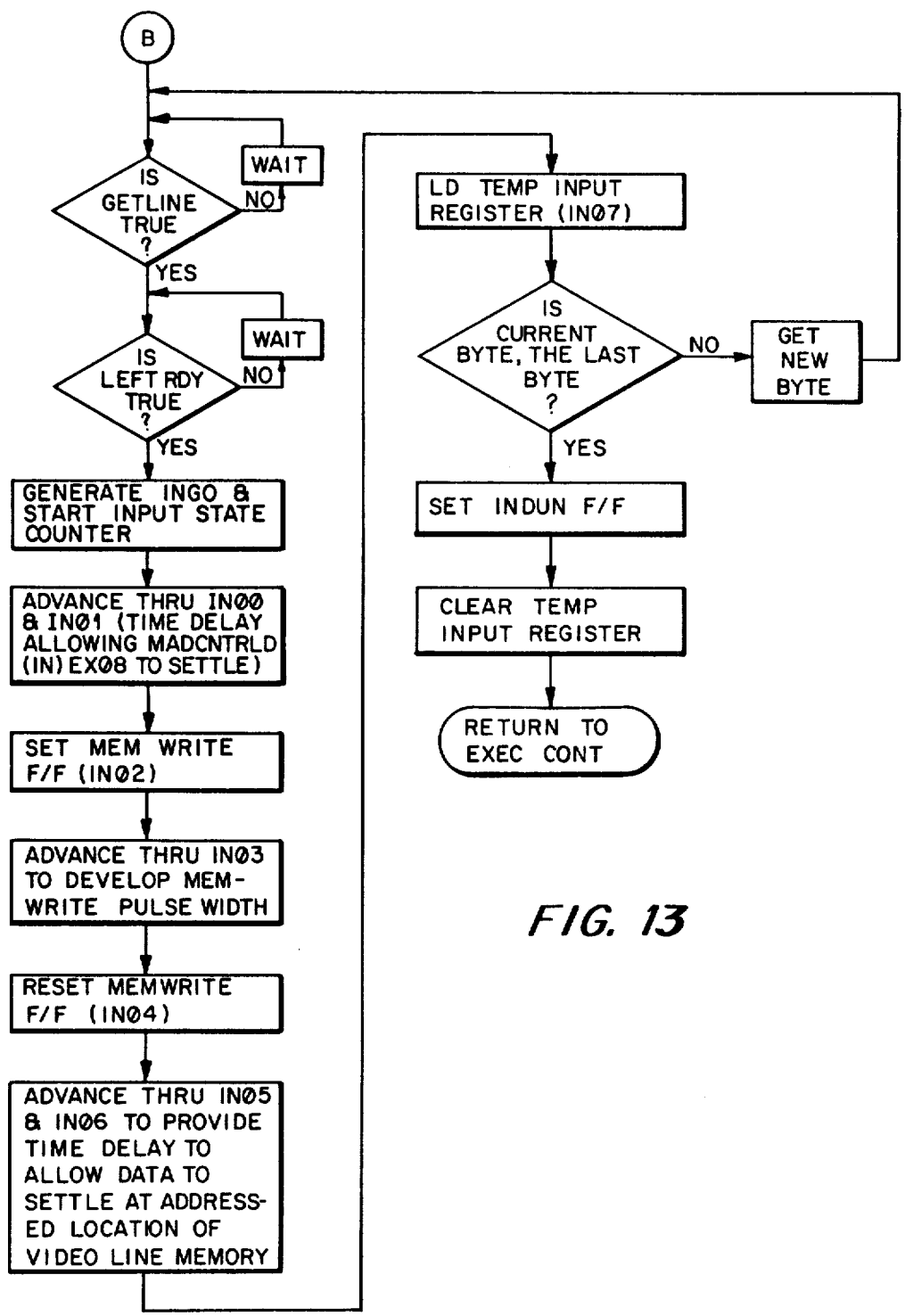
Figure 14:
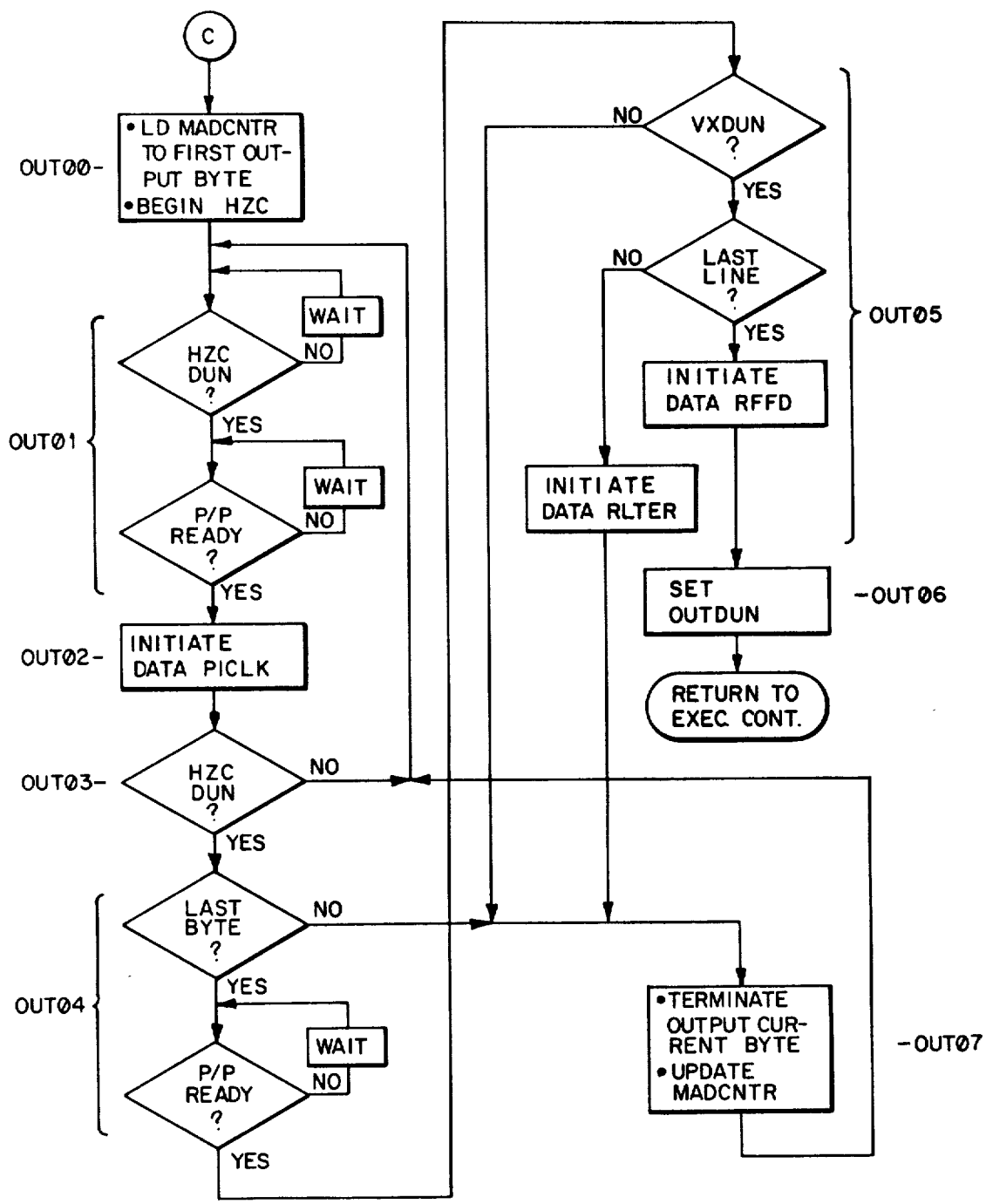

Reference is now had to FIG. 13 where the input controller routine will be described. The input controller includes certain input logic (shown in Appendix only) for inquiring whether the GET LINE signal is true; that is, to uniquely select the desired next video line to sample. If GET LINE is not true, the logic waits for it to go true. Once GET LINE goes true, this input logic next inquires whether LEFT RDY is true. If not, the logic waits for it to go true. The LEFT RDY circuits 438 and 440 allow selection of a unique portion of any line to be sampled. Once LEFT RDY goes true, the input logic generates an INGO signal and starts an input state counter (not shown) forming part of the input controller.

The counter operates at very high speed synchronously with the incoming video being sampled. The counter advances through states zero and one (IN$\phi\phi$ and IN$\phi$1) which establishes a time delay allowing LDMADCNTR(IN) of EX$\phi$8 to settle, i.e. time for MADCNTR to be initialized, plus the time for the memory adress counter to influence the memory to index to the initial address.

The input controller next advances to its counter state two (IN$\phi$2) where it sets a MEMWRITE flip-flop (shown in Appendix only). The input controller than advances through its counter state three (IN$\phi$3) in order to develop a MEMWRITE pulse width. At counter state four (IN$\phi$4), the MEMWRITE flip-flop is reset. Following this operation, the counter advances through its states five and six (IN$\phi$5 and IN$\phi$6) to provide a time delay to allow data to settle at the addressed location of the video line memory 64.

Following this operation, the counter advances to its state seven (IN$\phi$7) where the LDTIR signal is raised to load the temporary input register 58 with the byte just assembled. The input controller contains additional logic circuitry (shown in Appendix only) for inquiring whether the current byte first formed is the last byte. If no, the input controller gets a new byte and returns to the beginning of its routine. If yes, the input controller sets an INDUN flip-flop (not shown) to raise the INDUN signal, then clears the temporary input register 58 and then returns to the executive controller routine at state EX$\phi$9.

The output controller routine will now be described with reference to FIG. 16. Note at this point that the printer/plotter 14 was left in a ready state in EX$\phi$5 and no commands have been issued to change that state. As shown, in FIG. 16, at state zero (OUT$\phi\phi$) of the output controller, the signal OUT$\phi\phi$ is true which is applied to the memory address counter 432 as LDMADCNTR (OUT) in order to load the counter to the first output byte, and as ENHX to the horizontal expansion circuits 70 in order to enable same. Following this operation, the output controller advances to its state one (OUT$\phi$1).

At state OUT$\phi$1, the output controller waits for body FRDY and HZCDUN to go true. When this occurs, it advances to state three (OUT$\phi$3) where it raises the DATA PICLK alluded to above, such signal ultimately being applied as VPICLK to the data select multiplexer 74 to cause the bytes of video line data gathered in the memory 64 to be transmitted a byte at a time to the printer/plotter 14 with horizontal expansion as selected. When the DATA PICLK signal is raised, the output controller advances to its state three.

At state OUT$\phi$3, the output controller either returns to its state OUT$\phi$1 if HZCDUN is false, or advances to its state four (OUT$\phi$4) if HZCDUN is true. It will be recalled that horizontal centering is such that bytes of null (zero) data via PICLK signals are sent to the printer/plotter 14 to cause the later video image to be centered on the hard copy medium (e.g. paper). At state OUT$\phi$4, the output controller first looks to see whether LAST BYTE is true. If not, it skips all the way to state seven (OUT$\phi$7) where the signal UPDATE MADCNTR causes the memory address counter 432 to increment to the address of the next byte to be stored in the video line memory 64. If LAST BYTE was true, the output controller waits for FRDY to go true. When this occurs, it advances to its state five (OUT$\phi$5).

At state OUT$\phi$5, the output controller initiates DATA RLTER+DATA RFFD only if both VXDUN and LAST LINE are true. If either VXDUN or LAST LINE are false, it skips to state OUT$\phi$7. If DATA RLTER+DATA RFFD were set true in state OUT$\phi$5, then the output controller waits for REMTO to go true and then advances to its state six (OUT$\phi$6) where it sets the OUTDUN signal true and returns to the executive controller routine at state EX1$\phi$. If the current output byte is the last byte of the last line, then a RFFD is issued in lieu of a RLTER that is issued at the last byte of all other lines.

Although the present invention has been described with respect to a presently preferred embodiment, it will be appreciated by those skilled in the art that various modifications, substitutions, etc. may be made without departing from the spirit and scope of the invention as defined in and by the following claims.

What is claimed is:

1. A phase-locked loop circuit comprising:
    a voltage controlled oscillator responsive to a control voltage for generating a periodic output signal comprised of pulses occurring at a first frequency determined by the value of said control voltage;

first means responsive to said output signal for generating a periodic feedback signal comprised of pulses occurring at a second frequency which bears a predetermined relationship toward said first frequency;

second means, responsive to said feedback signal and to a first input signal having a first periodic interval during which pulses at a third frequency occur and a second periodic interval during which said pulses at said third frequency do not occur, for generating an output signal comprised of the pulses of said first input signal during the first periodic interval of said first input signal and the pulses of said feedback signal during the second periodic interval of said first input signal; and third means responsive to the feedback signal from said first means and the output signal from said second means for generating said control voltage having a value dependent upon the phase differential between said feedback signal and the output signal from said second means.

2. The phase-locked loop circuit of claim 1, wherein said third frequency is substantially equal to said second frequency.

3. The phase-locked loop circuit of claim 1, wherein said first frequency is N times as great as said second frequency.

4. The phase-locked loop circuit of claim 1, wherein said first means comprises means for dividing the frequency of said output signal by a factor of N whereby said second frequency is 1/N that of said first frequency.

5. The phase-locked loop circuit of claim 1, wherein said first means comprises means for stretching the pulse width of the pulses of said feedback signal to make them substantially equal to the pulse width of the pulses of said first input signal.

6. The phase-locked loop circuit of claim 1, wherein said third frequency is substantially equal to said second frequency and said first means comprises:

means for dividing the frequency of said output signal by a factor of N whereby said second frequency is 1/N that of said first frequency; and means for stretching the pulse width of the pulses of said feedback signal to be substantially equal to the pulse width of the pulses of said first input signal.

7. The phase-locked loop circuit of claim 1, wherein said second means is further responsive to a second input signal comprised of a pulse occurring during each second periodic interval of said first input signal, said second means comprising:

a flip-flop circuit having a first output that is high when said flip-flop is set and a second output that is high when said flip-flop is reset; and a gate circuit responsive to the first and second outputs of said flip-flop circuit and to said first input signal and said feedback signal for developing said first input signal at its output when said flip-flop is set and said feedback signal at its output when said flip-flop is reset.

8. The phase-locked loop circuit of claim 7, wherein said gate circuit comprises:

a first AND-gate having a first input adapted to receive said first input signal and a second input connected to the second output of said flip-flop;

a second AND-gate having a first inverted input adapted to receive said feedback signal and a second input connected to the first output of said flip-flop; and a NOR-gate having a first input connected to the output of said first AND-gate and a second input connected to the output of said second AND-gate.

9. The phase-locked loop circuit of claim 7, wherein said flip-flop is reset at each pulse of said second input signal.

10. The phase-locked loop circuit of claim 9, wherein said second means further comprises:

means enabled upon the resetting of said flip-flop for counting a predetermined number of the pulses of said feedback signal and for providing an output signal upon reaching said predetermined count; and means responsive to the concurrence of the output signal from said means for counting and the next pulse of said first input signal for clocking said flip-flop set again.

11. The phase-locked loop circuit of claim 10, wherein said gate circuit comprises:

a first AND-gate having a first inverted input adapted to receive said first input signal and a second input connected to the second output of said flip-flop;

a second AND-gate having a first input adapted to receive said feedback signal and a second input connected to the first output of said flip-flop; and a NOR-gate having a first input connected to the output of said first AND-gate and a second input connected to the output of said second AND-gate.

12. The phase-locked loop circuit of claim 11, wherein said third frequency is substantially equal to said second frequency and said first means comprises:

means for dividing the frequency of said output signal by a factor of N whereby said second frequency is 1/N that of said first frequency; and means for stretching the pulse width of the pulses of said feedback signal to be substantially equal to the pulse width of the pulses of said first input signal.

* * * * *